(12) United States Patent
Zhang

(10) Patent No.: US 10,305,505 B1
(45) Date of Patent: May 28, 2019

(54) INTERPOLATION DIGITAL-TO-ANALOG CONVERTER (DAC)

(71) Applicant: Texas Instruments Incorporated, Dallas, TX (US)

(72) Inventor: Jun Zhang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/962,690

(22) Filed: Apr. 25, 2018

Related U.S. Application Data

(63) Continuation of application No. PCT/CN2017/117729, filed on Dec. 21, 2017.

(51) Int. Cl.
*H03M 1/66* (2006.01)
*H03M 1/68* (2006.01)
*H03M 1/78* (2006.01)

(52) U.S. Cl.
CPC .............. *H03M 1/68* (2013.01); *H03M 1/66* (2013.01); *H03M 1/785* (2013.01)

(58) Field of Classification Search
CPC ........... H03M 1/68; H03M 1/785; H03M 1/66
USPC ................................. 341/144, 154
See application file for complete search history.

(56) References Cited

U.S. PATENT DOCUMENTS

| | | | |
|---|---|---|---|
| 5,396,245 A | 3/1995 | Rempfer | |
| 5,977,898 A | 11/1999 | Ling et al. | |
| 5,999,115 A * | 12/1999 | Connell | H03M 1/687 341/145 |
| 6,130,634 A | 10/2000 | Wadsworth et al. | |
| 6,246,351 B1 | 6/2001 | Yilmaz | |
| 6,448,917 B1 | 9/2002 | Leung et al. | |
| 6,489,905 B1 * | 12/2002 | Lee | H03M 1/1057 341/120 |
| 6,617,989 B2 | 9/2003 | Deak | |
| 6,621,439 B1 | 9/2003 | Bugeja | |

(Continued)

FOREIGN PATENT DOCUMENTS

CN 101877590 A 11/2010

OTHER PUBLICATIONS

Fogleman et al., "A Dynamic Element Matching Technique for Reduced-Distortion Multibit Quantization in Delta-Sigma ADCS", IEEE International Symposium on Circuits and Systems, 1999 IEEE, 4 pages.

(Continued)

*Primary Examiner* — Brian K Young
(74) *Attorney, Agent, or Firm* — Kenneth Liu; Charles A. Brill; Frank D. Cimino

(57) ABSTRACT

A segmented digital-to-analog converter (DAC) circuit includes an interpolation resistor DAC (RDAC) and a buffer amplifier. The interpolation RDAC includes a resistor-two-resistor (R-2R) DAC and a resistor ladder. The R-2R DAC is configured to receive a first subword and generate an analog output signal with a voltage representative of the first subword. The first subword has an integer number M bits that include a most significant bit (MSB) of a digital input signal. The resistor ladder is configured to receive the analog output signal and a second subword and generate an analog interpolated signal. The second subword has an integer number I bits that include an intermediate significant bit (ISB) of the digital input signal The buffer amplifier is configured to receive the analog interpolated signal and generate an output signal for the segmented DAC.

18 Claims, 15 Drawing Sheets

(56) References Cited

U.S. PATENT DOCUMENTS

| | | |
|---|---|---|
| 6,707,404 B1 | 3/2004 | Yilmaz |
| 6,781,536 B1 | 8/2004 | Martins |
| 6,897,794 B2 | 5/2005 | Kuyel et al. |
| 6,970,122 B1 | 11/2005 | Yilmaz et al. |
| 7,283,082 B1 | 10/2007 | Kuyel |
| 7,522,083 B2 * | 4/2009 | Sahara ................ H03M 1/1061 341/144 |
| 7,675,450 B1 | 3/2010 | Tabatabaei et al. |
| 7,710,300 B2 * | 5/2010 | Kwan ................... H03M 3/416 341/143 |
| 7,796,060 B2 | 9/2010 | Oberhuber et al. |
| 8,134,486 B2 | 3/2012 | Lai et al. |
| 8,188,899 B2 | 5/2012 | Motamed |
| 8,212,703 B2 | 7/2012 | Katsis et al. |
| 8,274,417 B2 | 9/2012 | Zhao et al. |
| 8,476,971 B2 | 7/2013 | Peng et al. |
| 8,618,971 B1 | 12/2013 | Li |
| 9,178,524 B1 | 11/2015 | Lee et al. |
| 9,300,318 B1 | 3/2016 | Medina Sanchez-Castro |
| 9,618,971 B1 | 4/2017 | Hayden et al. |
| 9,654,135 B2 | 5/2017 | Miki et al. |
| 10,020,817 B1 | 7/2018 | Zhang |
| 2003/0117307 A1 | 6/2003 | Deak |
| 2005/0146452 A1 | 7/2005 | Kuyel |
| 2008/0100489 A1 | 5/2008 | Trifonov et al. |
| 2011/0102226 A1 | 5/2011 | Cosgrave |

OTHER PUBLICATIONS

Shagun Bajaoria, "Precision Current Mirror", Jul. 2010, Delft University of Technology, Master of Science Thesis, 99 pages.

* cited by examiner

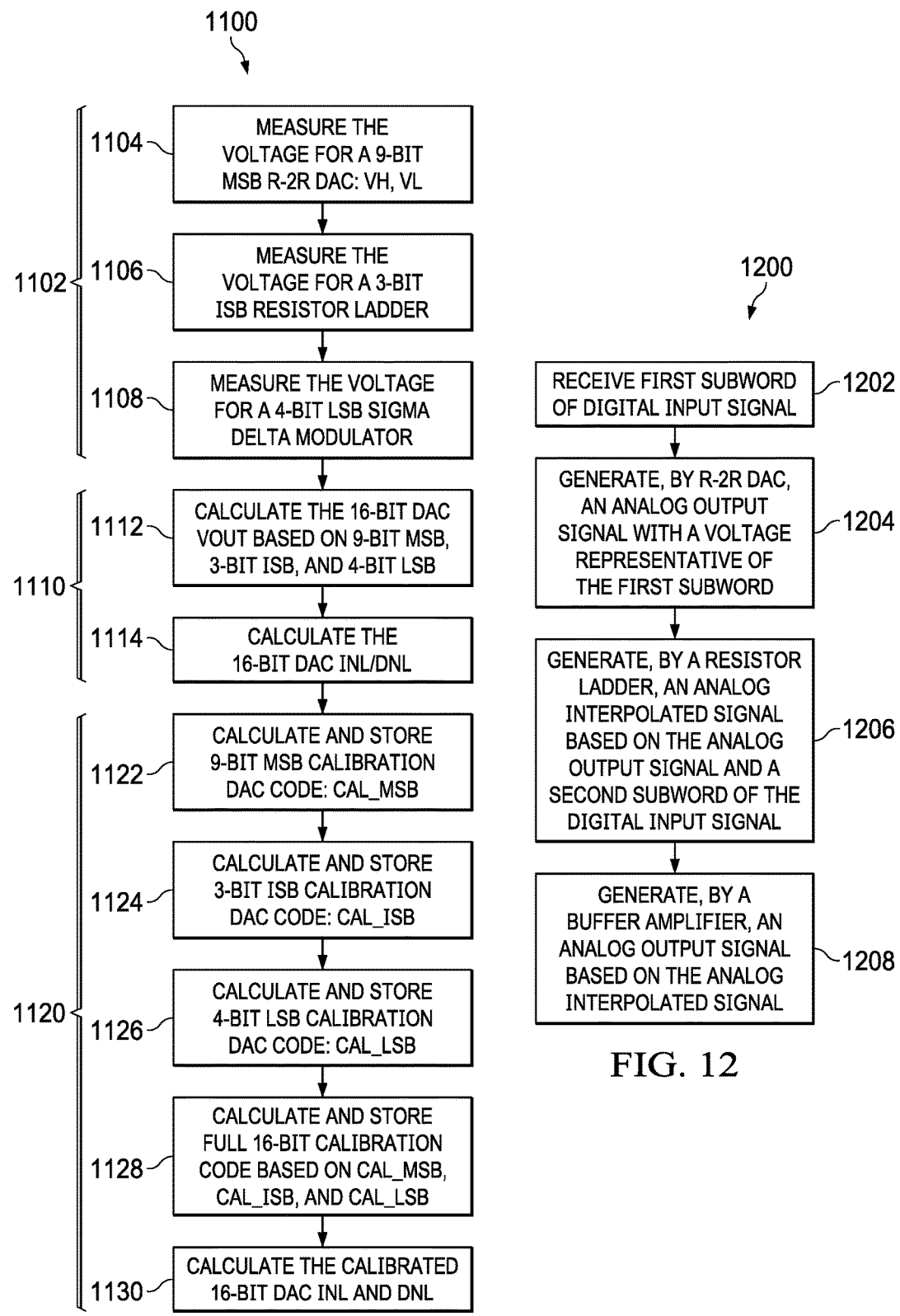

INTERPOLATION DIGITAL-TO-ANALOG CONVERTER (DAC)

BACKGROUND

A digital-to-analog converter (DAC) is an electrical circuit that converts digital signals into analog signals, DAC circuits are often employed in conjunction with (or integrated into) microcontrollers or microprocessor circuits to convert digital values to analog signals for a variety of applications. High DAC accuracy is desirable in many applications, such as medical devices, optical devices industrial control products, display drivers, etc. Higher accuracy DACs typically occupy significant circuit area, and increased bit accuracy generally results in significant increases in the number of switches and resistor elements. In addition, more calibration memory and calibration time are required for DAC circuits that provide high bit accuracy.

SUMMARY

In accordance with at least one embodiment of the disclosure, a segmented DAC circuit includes an interpolation resistor DAC (RDAC) and a buffer amplifier. The interpolation RDAC includes a resistor-two-resistor (R-2R) DAC and a resistor ladder. The R-2R DAC is configured to receive a first subword and generate an analog output signal with a voltage representative of the first subword. The first subword has an integer number M bits that include a most significant bit (MSB) of a digital input signal. The resistor ladder is configured to receive the analog output signal and a second subword and generate an analog interpolated signal. The second subword has an integer number I bits that include an intermediate significant bit (ISB) of the digital input signal The buffer amplifier is configured to receive the analog interpolated signal and generate an output signal for the segmented DAC.

Another illustrative embodiment is an interpolation RDAC that includes an R-2R DAC and a resistor ladder. The R-2R DAC is configured to receive a first subword and generate an analog output signal with a voltage representative of the first subword. The first subword has an integer number M bits that include a most significant bit MSB of a digital input signal. The resistor ladder is configured to receive the analog output signal and a second subword and generate an analog interpolated signal. The second subword has an integer number I bits that include an intermediate significant bit ISB of the digital input signal The buffer amplifier is configured to receive the analog interpolated signal and generate an output signal for the segmented DAC.

Yet another illustrative embodiment is a method of converting a digital input signal into a corresponding analog output signal. The method includes receiving a first subword of the digital input signal. The first subword includes an integer number M bits that include a MSB of the digital input signal. The method also includes generating, by an R-2R DAC, an analog output signal with a voltage representative of the first subword. The method also includes generating, by a resistor ladder, an analog interpolated signal based on the analog output signal and a second subword. The second subword includes an integer number I bits that include an ISB of the digital input signal. The method also includes generating, by a buffer amplifier, the analog output signal based on the analog interpolated signal.

BRIEF DESCRIPTION OF THE DRAWINGS

For a detailed description of various examples, reference will now be made to the accompanying drawings in which:

FIG. 11 shows an illustrative flow diagram of a method for calibrating a segmented DAC in accordance with various examples; and FIG. 12 shows an illustrative flow diagram of a method of converting a digital input signal into a corresponding analog output signal.

NOTATION AND NOMENCLATURE

Figures 1, 2:
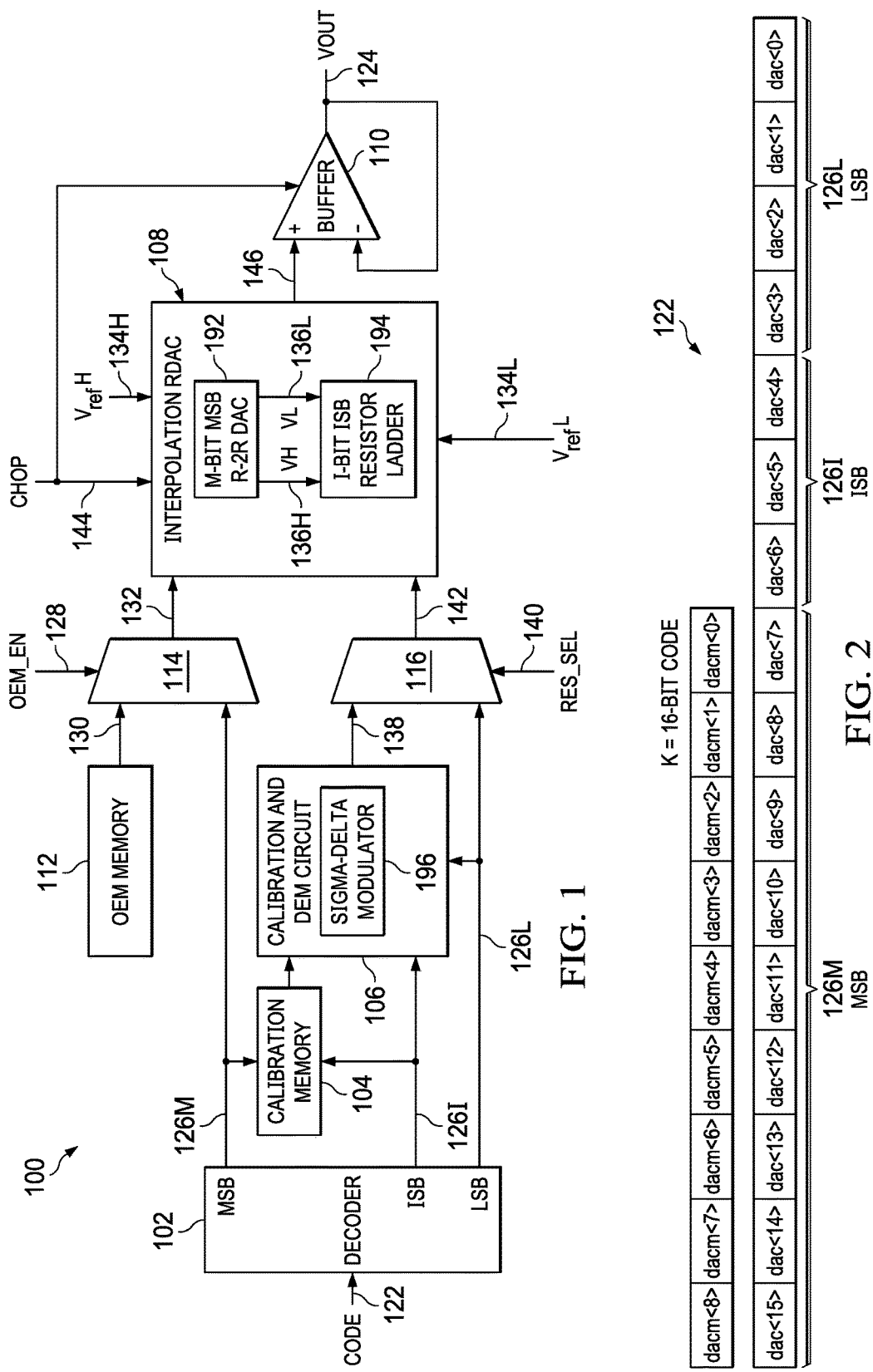
FIG. 1 shows a block diagram of an illustrative segmented DAC circuit in accordance with various examples.
FIG. 2 shows an illustrative digital input signal that is received by a segmented DAC circuit in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

DAC circuits convert digital signals into analog signals. High DAC accuracy (e.g., 16 bit resolution) is desirable in many applications, such as medical devices, optical devices industrial control products, display drivers, etc. Higher accuracy DACs typically occupy significant circuit area, and increased bit accuracy generally results in significant increases in the number of switches and resistor elements. In addition, more calibration memory and calibration time are required for DAC circuits that provide high bit accuracy.

Conventional DAC circuits for microcontrollers provide either 12-bit or lower resolution or have high die costs, a long calibration path, and/or a high degree of complexity. For example, some conventional DAC circuits require a relatively large number of switches for MSB interpolation. Additionally, some conventional DAC circuits include an interpolation amplifier adding complexity to the circuit. Therefore, it would be desirable for a DAC circuit to provide a highly accurate (e.g., 16 bit resolution), low cost, low complexity digital-to-analog conversion.

In accordance with various examples, a segmented DAC circuit is provided that utilizes an interpolation RDAC and a general buffer amplifier to generate an analog output signal from a digital input signal. The interpolation RDAC includes a MSB R-2R DAC to provide a coarse interpolation of the input signal and an ISB resistor ladder to generate the final interpolation of the input signal. The buffer amplifier receives the resulting interpolation signal and provides a unity voltage gain to the interpolation signal with a current gain. The resulting analog output signal is highly accurate (e.g., 16 bits) with a relatively low complexity (due to the use of the ISB resistor ladder instead and buffer amplifier instead of an interpolation amplifier) and cost. Such a DAC can be used in a wide variety of applications. In other words, the broad topology of such a circuit can be used for different function circuits. For example, such a DAC can be used for a digital control oscillator, a dot matrix LCD driver, etc.

FIG. 1 shows a block diagram of an illustrative segmented DAC circuit 100 in accordance with various examples. The segmented DAC 100 is configured to receive a K-bit binary-coded digital input signal (CODE) 122 (e.g., a 16 bit digital signal) and convert the CODE 122 into an analog output signal (VOUT) 124 which represents the value of the CODE 122. The CODE 122 can be received from any suitable digital signal source (e.g., a microcontroller). The segmented DAC circuit 100 includes, in an embodiment, an input decoder 102, calibration circuit 104, calibration and dynamic element matching (DEM) circuit 106, interpolation RDAC 108, buffer amplifier 110, ordered element matching (OEM) memory 112, and multiplexers 114-116. The decoder 102 is configured to receive the CODE 122 and buffer and parse the CODE 122 into three signals, MSB 126M, ISB 126I, and LSB, 126L without modification. For example, the CODE 122 includes an M-bit first subword (MSB), an I-bit second subword (ISB), and an L-bit third subword (LSB), where M, I, and L are each greater than 1, and K=M+I+L. The first subword is referred to herein as an "MSB subword" with M bits that includes a most significant bit of the CODE 122. The second subword is referred to herein as an "ISB" subword with I bits that includes intermediate significant bits of the CODE 122. The third subword is referred to herein as an "LSB subword" with L bits that include the least significant bit of the CODE 122. The decoder 102 buffers and parses the CODE 122 to output the M-bit first subword MSB 126M to an address input of calibration circuit 104. The decoder 122 also outputs the I-bit second subword ISB 126I to an address input of calibration circuit 104 and the L-bit third subword LSB 126L. In an embodiment, for a 16 bit CODE 122, the decoder 102 outputs a 9 bit MSB 126M, a 3 bit ISB 126I, and a 4 bit LSB 126L. In some embodiments, the decoder 102 performs additional, other digital signal operations on the CODE 122. Furthermore, in some embodiments, the decoder 102 is omitted.

The calibration circuit 104, in an embodiment, is configured to store calibration data indexed according to the first subword MSB 126M received at a first address input from the decoder 102 or according to the second subword ISB 126I received at a second address input from the decoder 102. For example, the calibration circuit 104 can store a first set of K×M bits of calibration data for calibration of the first subword MSB 126M and a second set of K×M bits of calibration data for calibration of the second subword ISB 126I. In some embodiments, the calibration circuit 104 provides a calibration code CAL CODE from the calibration data based on the CODE 122.

In addition to calibration circuit 104 receiving the first subword MSB 126M, the multiplexer 114 also, in an embodiment, is configured to receive the first subword MSB 126M as a first input. The second input of the multiplexer 114 is an M-bit OEM signal 130 received from the OEM memory 112. Thus, in an embodiment, the OEM signal 130 has the same number of bits as the first subword MSB 126M. The enable or select signal OEM_EN 128 is also received by the multiplexer 114 which provides a signal for the multiplexer 114 to output, labelled as output signal 132, either the OEM signal 130 or the first subword MSB 126M.

The calibration and DEM circuit 106 is configured to receive a calibration code from the calibration circuit 104. The calibration and DEM circuit 106, in some embodiments, also receives the second subword ISB 126I and third subword LSB 126L from the decoder 102. The calibration and DEM circuit 106 includes, in an embodiment, a sigma delta modulator (SDM) 196 which is a first-order modulator; however, in other embodiments, second order or higher order modulators can be used. The calibration and DEM circuit 106 generates a modulator code SDCODE for the SDM 196 based on the calibration code received from the calibration circuit 104, the second subword ISB 126I, and the third subword LSB 126L. In an embodiment, the SDM 196 modulates the modulator code SDCODE to generate an N-bit digital interpolation code signal ICODE 138 that represents a value of the second subword ISB 126I and third subword LSB 126L where N is less than I+L.

The multiplexer 116, in an embodiment, is configured to receive the third subword LSB 126L as a first input and the ICODE 138 as a second input. The enable or select signal RES_SEL 140 is also received by the multiplexer 116 which provides a signal for the multiplexer 116 to output, labelled as output signal 142, either the third subword LSB 126L or the ICODE 138. For example, in one state of RES_SEL 140, the multiplexer 116 provides the N-bit ICODE 138 to the interpolation RDAC 108 for (M+I+L)-bit resolution (e.g., 16 bit resolution for a 16-bit CODE 122). In another state of RES_SEL 140, the multiplexer 116 provides the third subword LSB 126L to the interpolation RDAC 108 for lower resolution.

The interpolation RDAC 108 is configured to receive, in an embodiment, the output signal 132 from multiplexer 114 and the output signal 142 from multiplexer 116. The interpolation RDAC 108 includes an M-bit MSB R-2R DAC 192 and an I-bit ISB resistor ladder 194. In an embodiment, the MSB R-2R DAC 192 receives the output signal 132 from the multiplexer 114. The MSB R-2R DAC 192 includes, in some embodiments, a resistor circuit and a switching circuit that operates according to the M-bit input from the output signal 132. The MSB R-2R DAC 192 operates according to a reference voltage and an analog voltage divider to output a first analog output signal. For example, the MSB R-2R DAC 192 is configured to receive reference voltages VrefH 134H and VrefL 134L. A voltage divider circuit is formed by resistors in the MSB R-2R DAC 192 to provide the first analog output signal at or between the levels of the reference voltages VrefH 134H and VrefL 134L according to the M-bit input from the multiplexer 114. In operation, when the multiplexer 114 delivers the first subword MSB 126M, the first analog output signal represents the value of the first subword MSB 126M. In the example shown in FIG. 1, the MSB R-2R DAC 192 generates a differential first analog output signal VH 136H, VL 136L. In other embodiments, the MSB R-2R DAC 192 generates a single-ended first analog output signal. In some embodiments, the MSB R-2R DAC 192 includes a resistive chopper circuit operating according to a single or multi-bit chopper switching control signal (chop) 144.

The ISB resistor ladder 194 is configured to receive the first analog output signal VH 136H, VL 136L from the MSB R-2R DAC 192. The ISB resistor ladder 194 is, in an embodiment, a resistor ladder that generates an analog interpolated signal 146. The analog interpolated signal 146 is an analog version of the CODE 122.

The buffer amplifier 110 is configured to receive the analog interpolated signal 146 from the interpolation RDAC 108. In some embodiments, the buffer amplifier 110 is a unity gain buffer amplifier that applies a negative feedback to an operational amplifier to generate VOUT 124. Thus, the voltage gain of the analog interpolated signal 146 is, in an embodiment, one (i.e., 0 dB). However, in some embodiments, the buffer amplifier 110 generates current gain of greater than one. For example, the input impedance of the buffer amplifier 110 is, in an embodiment, relatively high (e.g., greater than 1 MΩ) while the output impedance is relatively low. Therefore, the buffer amplifier 110 generates VOUT 124 as if it were a voltage source. In some embodiments, the buffer amplifier 110 includes a resistive chopper circuit operating according to a single or multi-bit chopper switching control signal (chop) 144. Additionally, in some embodiments, an offset cancellation is applied within the general buffer 110 if any offset is introduced in the DAC circuit 100.

FIG. 2 shows an illustrative digital input signal CODE 122 that is received by DAC circuit 100 in accordance with various examples. In the example shown in FIG. 2, CODE 122 is 16-bit (K=16). The 16-bit example CODE 122 includes a 9-bit first subword MSB 126M (M=9), a 3-bit second subword ISB 126I (I=3), and a 4-bit third subword LSB 126L (L=4). The first subword MSB 126M includes bits dac<15:7> (dacm<8:0>). The second subword ISB 126I includes bits dac<6:4>. The third subword LSB 126L includes bits dac<3:0>.

Figure 3:
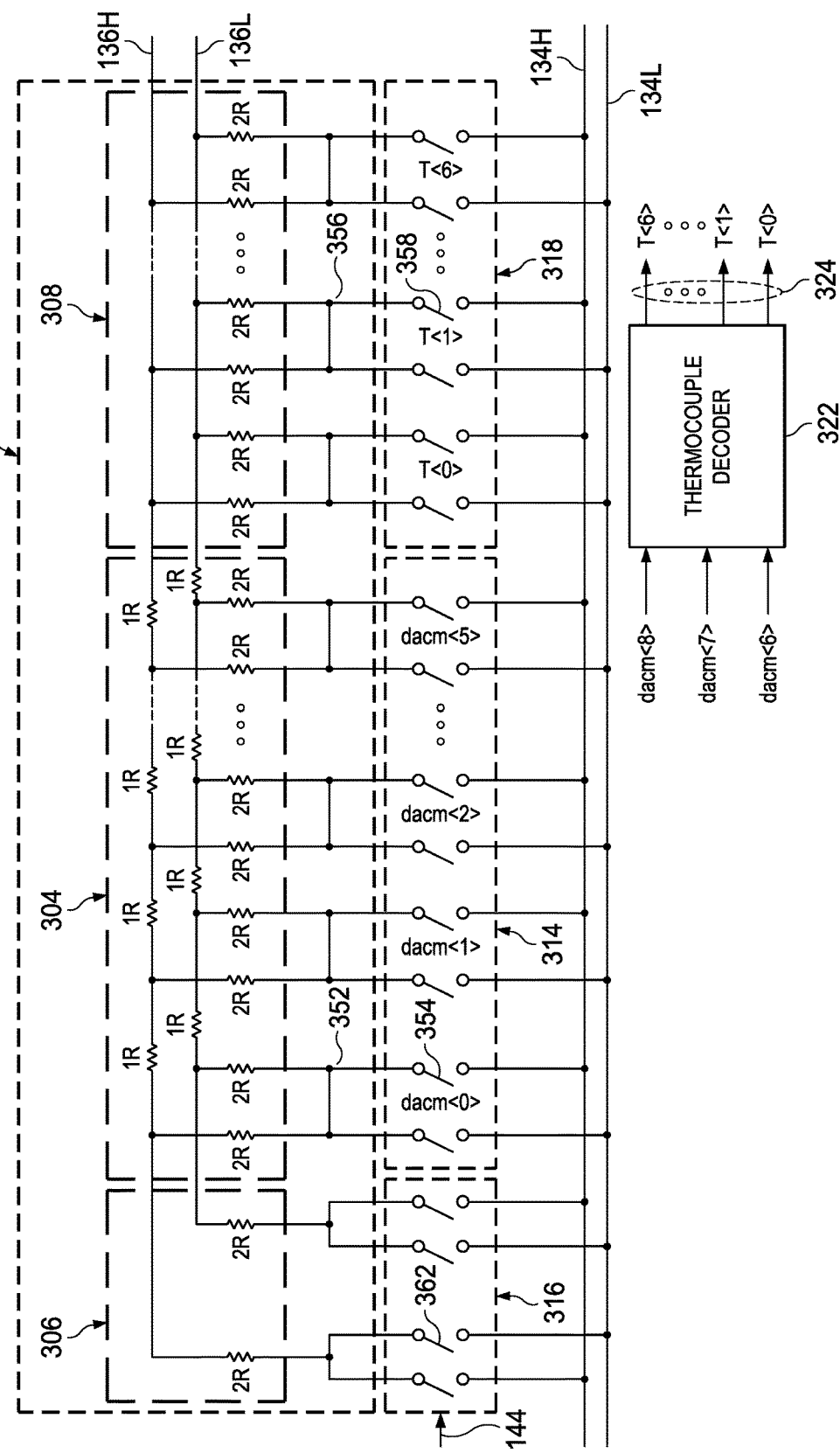
FIG. 3 shows an illustrative circuit diagram of a 9-bit MSB R-2R DAC for an interpolation RDAC of a segmented DAC circuit in accordance with various examples.

FIG. 3 shows an illustrative circuit diagram of a 9-bit MSB R-2R DAC 192 for the interpolation RDAC 108 of the segmented DAC circuit 100 in accordance with various examples. In the example shown in FIG. 3, the MSB R-2R DAC 192 also includes chopper circuits and DEM circuitry which are not required for all possible implementations. As discussed above, the MSB R-2R DAC 192 is configured, in an embodiment, to generate the first analog output signal VH 136H, VL 136L utilizing VrefH 134H and VrefL 134L as reference voltage signals.

The 9-bit MSB R-2R DAC 192 includes, in an embodiment, a resistor circuit 302. The resistor circuit 302 includes an R-2R circuit 304 and a first switching circuit 314. The resistors in the resistor circuit 302 are formed into resistor elements of resistance values of 1R (unity resistor) and 2R (2×the unity resistor and/or 2 unity resistors in series). In other words, the resistors in the resistor circuit 302 are, in an embodiment, based on the value of a unity resistor. The resistor circuit 302 is configured as a series of segments that each individually include a tap node (e.g., tap node 352).

The R-2R circuit 304 includes, in an embodiment, M or fewer segments. For example, for a first subword 9-bit MSB 126M, the R-2R circuit 304 includes 9 or fewer segments. Each segment includes two R-2R portions individually associated with a corresponding one of the differential outputs 136. Each of the portions includes a resistor element with a resistance value of 1R connected in series with the 1R elements of the other segments, as well as a resistor element having a resistance 2R connected to the switching circuit 314 at a corresponding tap node (e.g., tap node 352). The illustrated example is a differential R-2R circuit. However, as discussed above, single-ended implementations are possible with a single output line 136, and each R-2R segment including a single 1R resistor element and a single 2R resistor element. The individual resistor elements (1R and/or 2R) can be single resistor components or can be multiple resistor components connected in any suitable series and/or parallel configuration to provide the corresponding 1R or 2R resistance.

The first switching circuit 314 includes, in an embodiment, a plurality of switches (e.g., switch 354) individually connected between a corresponding one of the tap nodes (e.g., tap node 352) and the input reference voltages VrefH 134H and VrefL 134L. In the illustrated differential example, the switching circuit 314 includes a first and second switch for each R-2R segment. Each switch is connected between the segment tap node and a corresponding one of the input reference voltages VrefH 134H and VrefL 134L. The switches of switching circuit 314 are operated in complementary fashion according to a corresponding one of the first subword bits dacm<8:0> (dac<15:7>) to connect the corresponding tap node with the input VrefH 134H or VrefL 134L.

In the example of FIG. 3, the resistor circuit 304 includes 6 segments switched according to the first 6 MSB bits dacm <5:0>, and the remaining 3 MSB bits dacm<8:6>(e.g., the 3 most significant bits of the MSB bits) are provided as inputs to a thermocouple decoder 322. Thus, in the example of FIG. 3, the MSB R-2R DAC 192 is a 3-bit thermal decode and 6-bit binary decode circuit. The thermocouple decoder 322 includes, in an embodiment, an output 324 that provides thermocouple coded switching control signals T<6:0> to operate an OEM switching circuit 318. Ordered element matching is implemented by a resistive OEM circuit 308 with, in the example shown in FIG. 3, 7 sets of OEM resistor elements. In an embodiment, the resistor elements of the OEM circuit 308 have resistances of 2R. A 2R resistor element of each set of OEM resistor elements is connected between an OEM tap node (e.g., OEM tap node 356) and a corresponding one of the outputs VH 136H, VL 136L. The OEM switching circuit 318 includes, in the example shown in FIG. 3, 7 sets of two OEM switches (e.g., OEM switch 358) to selectively connect a corresponding one of the OEM resistor elements between the inputs VrefH 134H, VrefL 134L and the outputs VH 136H, VL 136L based on an OEM code set by the switching control signals T<6:0> from the thermocouple decoder 322. The OEM switches of OEM switching circuit 318 are operated in complementary fashion according to a corresponding one of the control signals T<6:0> to connect the corresponding OEM tap node (e.g. OEM tap node 356) with the input VrefH 134H or VrefL 134L.

The number of thermocouple bits that are decoded in the 9-bit MSB R-2R DAC 192 and whether there is a 0.5 LSB shift determines, in some embodiments, the total resistance in the resistor ladder 194. The table below shows the total resistance utilized by the resistor ladder 194 for 3-bit interpolation:

| MSB R-2R DAC 192 | | Total Resistance for Resistor Ladder 194 for 3-bit Interpolation | |
|---|---|---|---|
| Thermocouple Bits | Binary Bits | With 0.5LSB Shift | Without 0.5 LSB Shift |
| 0 bit | x bit | 14R | 6R |
| 2 bit | x bit | 7R | 3R |
| 3 bit | x bit | 3.5R | 1.5R |
| 4 bit | x bit | 1.75R | 0.75R |

The MSB R-2R DAC 192 in FIG. 3 also includes a resistive chopper circuit 306 with a plurality of chopper resistors of resistance value 2R and a chopper switching circuit 316. The chopper switching circuit 316 includes, in an embodiment, a plurality of chopper switches (e.g., chopper switch 362) to selectively and concurrently connect a corresponding one of the chopper resistors to the inputs VrefH 134H, VrefL 134L. Additionally, the chopper switching circuit 316 is configured to receive the chopper code "chop" 144. The chopper circuitry (e.g., resistive chopper circuit 306 and chopper switching circuit 316) can be omitted in some embodiments, with the R-2R circuitry (e.g., R-2R circuit 304, first switching circuit 314, OEM circuit 308, OEM switching circuit 318, and/or thermocouple decoder 322) providing component segments for all the MSB bits dacm<9:0>.

The MSB R-2R DAC 192 in FIG. 3 operates according to the MSB bits <5:0>. The switches of the first switching circuit 314 are switched between V=0 (logic 0) and V=Vref (logic 1), where Vref=VrefH 134H−VrefL 134L in the illustrated differential example. The R-2R network causes the MSB digital bits to be weighted in their contribution to the outputs VH 136H, VL 136L and thus, voltage VOUT 124. Depending on which bits are set to 1 and which to 0, the output VOUT 124 has a corresponding stepped value between 0 and Vref minus the value of the minimal step, corresponding to bit 0 (dacm<0>). The actual value of Vref (and the voltage of logic 0) will depend on the type of technology used to generate the digital signals. An R-2R DAC is a binary weighted voltage divider. The 2R leg in parallel with each 1R resistor in series creates a binary weighting, and only one bit of the first subword MSB 126M is needed for each bit of resolution. The switch is either connected to ground or to the reference voltage. In addition, the equivalent impedance of the resistor ladder is typically lower than that of conventional string DACs, and therefore, the MSB R-2R DAC 192 has lower noise.

Figure 4A:
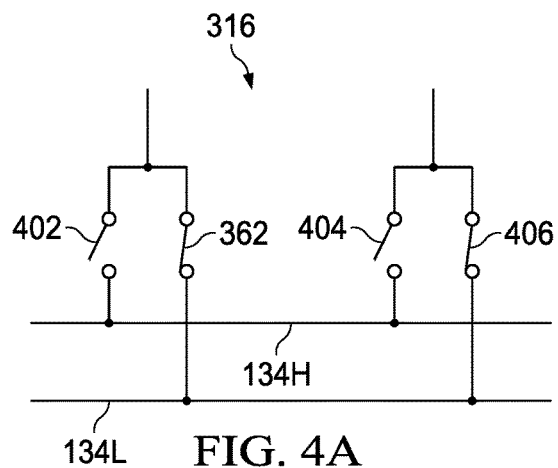
FIGS. 4A-D show illustrative circuit diagrams of a chopper switching circuit in accordance with various examples.
Figure 4B:
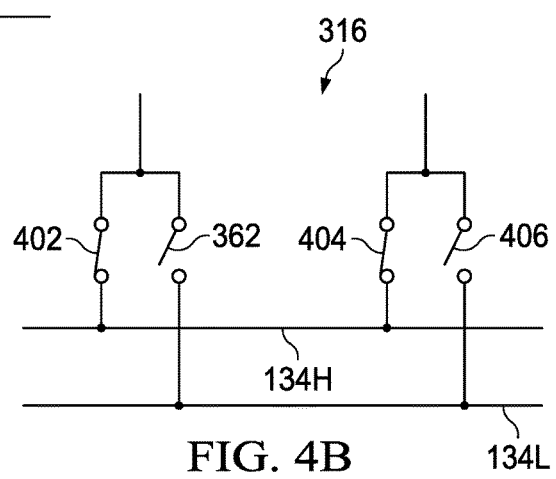

FIGS. 4A-D show illustrative circuit diagrams of the chopper switching circuit 316 in accordance with various examples. In FIGS. 4A and 4B, the chopper switching circuit 316 is configured such that switches 402 and 404 are connected to VrefH 134H while switches 362 and 406 are connected to VrefL 134L. FIG. 4A shows an example configuration of the switches when the chop 144 is LOW (equals zero). In such a configuration, switches 402 and 404 are open while switches 362 and 406 are closed. FIG. 4B shows an example configuration of the switches when the chop 144 is HIGH (equals 1). In such a configuration, switches 402 and 404 are closed while switches 362 and 406 are open.

Figure 4C:
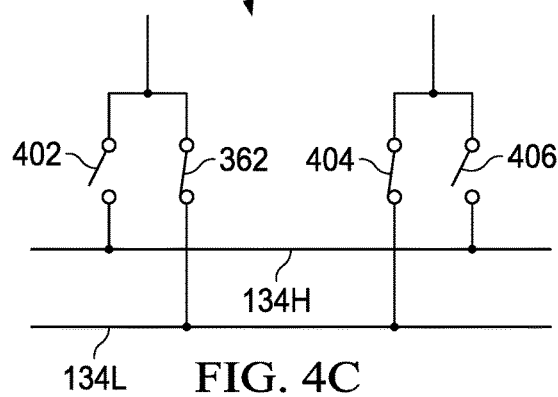
Figure 4D:
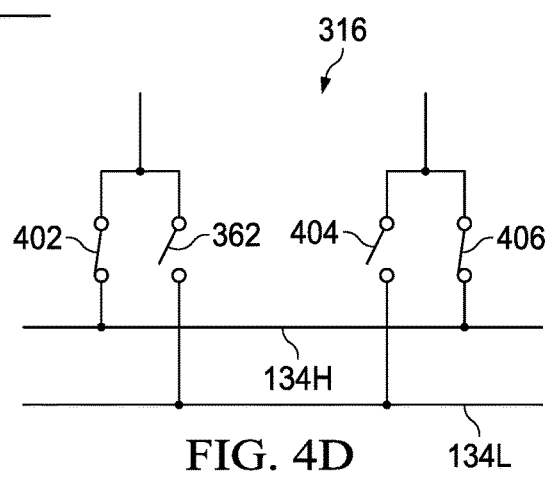

In FIGS. 4C and 4D, the chopper switching circuit 316 is configured such that switches 402 and 406 are connected to VrefH 134H while switches 362 and 404 are connected to VrefL 134L. FIG. 4C shows an example configuration of the switches when the chop 144 is LOW (equals zero). In such a configuration, switches 402 and 406 are open while switches 362 and 404 are closed. FIG. 4D shows an example configuration of the switches when the chop 144 is HIGH (equals 1). In such a configuration, switches 402 and 406 are closed while switches 362 and 404 are open.

Figure 5A:
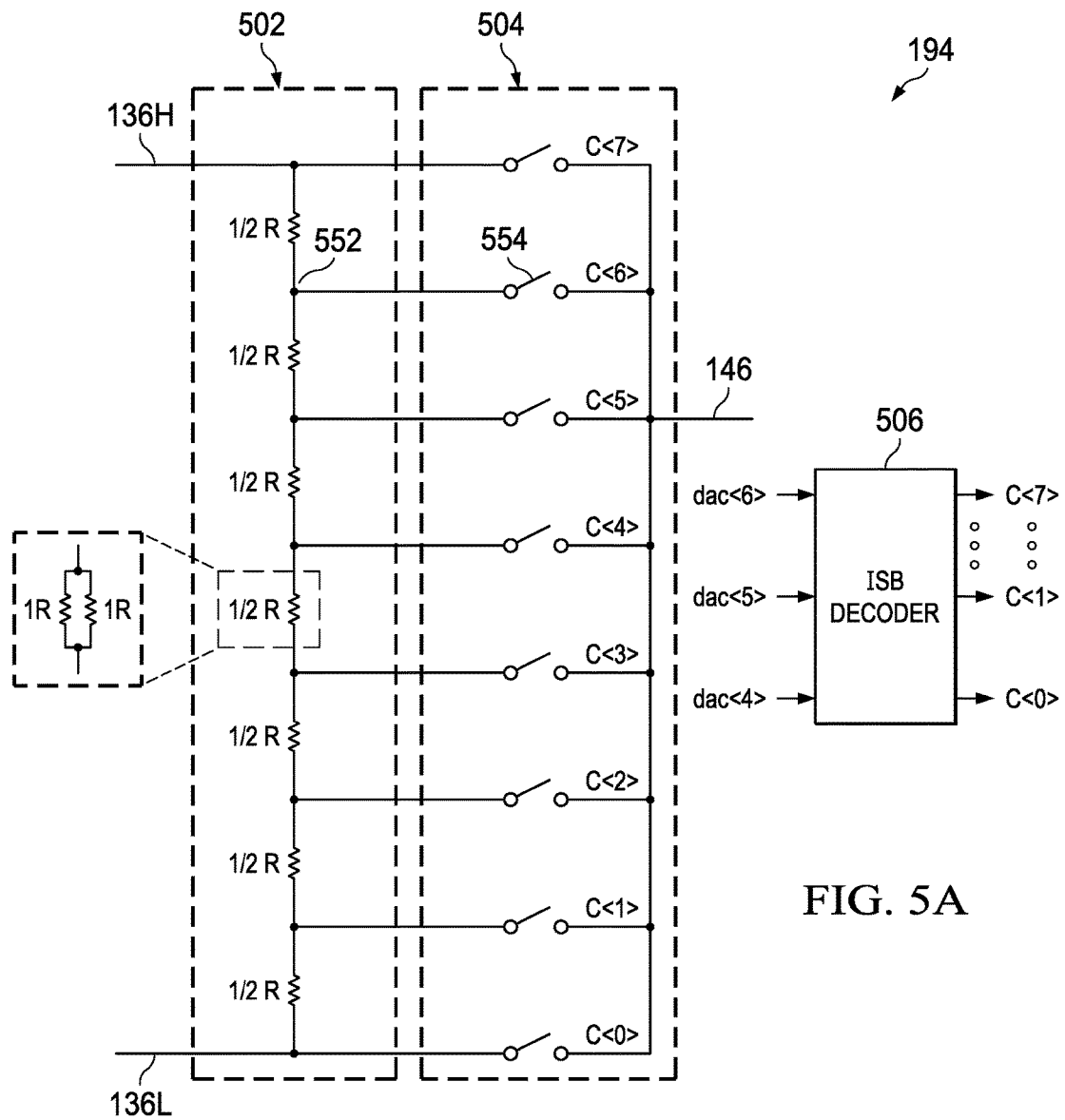
FIGS. 5A-B show illustrative circuit diagrams of a 3-bit ISB resistor ladder for an interpolation RDAC with a 9-bit MSB R-2R DAC that has 3 thermocouple bits in accordance with various examples.
Figure 5B:
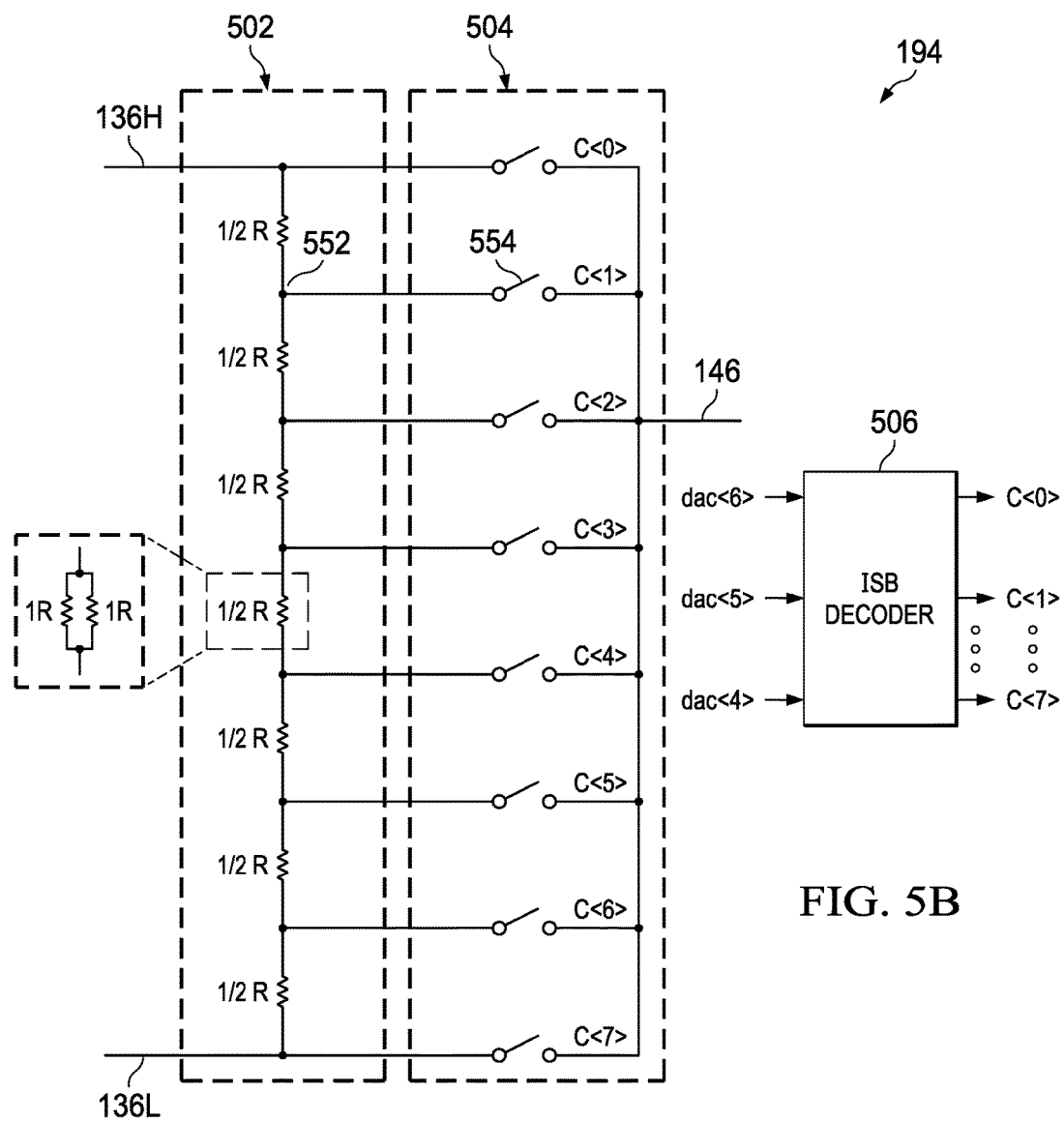

FIGS. 5A-B show illustrative circuit diagrams of a 3-bit ISB resistor ladder 194 for the interpolation RDAC 108 with a 9-bit MSB R-2R DAC 192 that has 3 thermocouple bits as shown in FIG. 3 in accordance with various examples. As discussed above, the ISB resistor ladder 194 is configured, in an embodiment to generate the analog interpolated signal 146 utilizing the first analog output signal VH 136H, VL 136L. In the examples shown in FIGS. 5A-B, a 0.5 LSB shift is provided in the analog interpolated signal 146.

The ISB resistor ladder 194 of FIGS. 5A-B includes in an embodiment, a resistor circuit 502 and a switching circuit 504. The resistors in the resistor circuit 502 are formed into resistor elements of resistance values of ½ R (half of a unity resistor and/or 2 unity resistors in parallel). In other words, the resistors in the resistor circuit 502 are, in an embodiment, based on the value of a unity resistor. The resistor circuit 502 is composed, in an embodiment, of a series of resistor elements (7 resistor elements in the example of FIGS. 5A-B in order to generate 8 voltage levels for a 0.5 LSB shift), separated by tap nodes (e.g., tap node 552). For example, the resistor elements can be connected in series with one another to define a plurality of tap nodes between adjacent ones of the resistor elements. The switching circuit 504 includes, in an embodiment, a plurality of switches (e.g., switch 554) individually connected between a corresponding one of the tap nodes (e.g., tap node 552) and the output of the ISB resistor ladder 194.

In the example of FIGS. 5A-B, the 3 ISB bits dac<6:4> are provided as inputs to a binary decoder 506. The binary decoder 506 provides switching control signals c<7:0> by activating one of the eight output bits for each input value from 0 to 7 to operate the switching circuit 504. The switches of switching circuit 504 are operated in complementary fashion according to a corresponding one of the control signals c<7:0> from the binary decoder 506 to connect the corresponding tap node (e.g., tap node 552) with the output of the ISB resistor ladder 194 to generate the analog interpolated signal 146. The example shown in FIG. 5A is for a circuit in which the chop 144 is LOW while the example shown in FIG. 5B is for a circuit in which the chop 144 is HIGH.

The table below shows an example of the decoding and ideal analog interpolated signal 146 that can be generated by the resistor ladder 194 as shown in FIGS. 5A-B.

| Chop | dacm<6> | dacm<5> | dacm<4> | C<7> | C<6> | C<5> | C<4> | C<3> | C<2> | C<1> | C<0> | Ideal Signal 146 |
|---|---|---|---|---|---|---|---|---|---|---|---|---|
| 0 | 0 | 0 | 0 | 0 | 0 | 0 | 0 | 0 | 0 | 0 | 1 | 0.5 * LSB |
| 0 | 0 | 0 | 1 | 0 | 0 | 0 | 0 | 0 | 0 | 1 | 0 | 1 + 0.5 * LSB |
| 0 | 0 | 1 | 0 | 0 | 0 | 0 | 0 | 0 | 1 | 0 | 0 | 2 + 0.5 * LSB |
| 0 | 0 | 1 | 1 | 0 | 0 | 0 | 0 | 1 | 0 | 0 | 0 | 3 + 0.5 * LSB |
| 0 | 1 | 0 | 0 | 0 | 0 | 0 | 1 | 0 | 0 | 0 | 0 | 4 + 0.5 * LSB |
| 0 | 1 | 0 | 1 | 0 | 0 | 1 | 0 | 0 | 0 | 0 | 0 | 5 + 0.5 * LSB |
| 0 | 1 | 1 | 0 | 0 | 1 | 0 | 0 | 0 | 0 | 0 | 0 | 6 + 0.5 * LSB |
| 0 | 1 | 1 | 1 | 1 | 0 | 0 | 0 | 0 | 0 | 0 | 0 | 7 + 0.5 * LSB |
| 1 | 0 | 0 | 0 | 1 | 0 | 0 | 0 | 0 | 0 | 0 | 0 | 0.5 * LSB |
| 1 | 0 | 0 | 1 | 0 | 1 | 0 | 0 | 0 | 0 | 0 | 0 | 1 + 0.5 * LSB |
| 1 | 0 | 1 | 0 | 0 | 0 | 1 | 0 | 0 | 0 | 0 | 0 | 2 + 0.5 * LSB |
| 1 | 0 | 1 | 1 | 0 | 0 | 0 | 1 | 0 | 0 | 0 | 0 | 3 + 0.5 * LSB |
| 1 | 1 | 0 | 0 | 0 | 0 | 0 | 0 | 1 | 0 | 0 | 0 | 4 + 0.5 * LSB |
| 1 | 1 | 0 | 1 | 0 | 0 | 0 | 0 | 0 | 1 | 0 | 0 | 5 + 0.5 * LSB |
| 1 | 1 | 1 | 0 | 0 | 0 | 0 | 0 | 0 | 0 | 1 | 0 | 6 + 0.5 * LSB |
| 1 | 1 | 1 | 1 | 0 | 0 | 0 | 0 | 0 | 0 | 0 | 1 | 7 + 0.5 * LSB |

The chop 144 swaps the decoder output c<0:7> so that the output voltage is the same for the same dacm <6:4>.

Figure 6A:
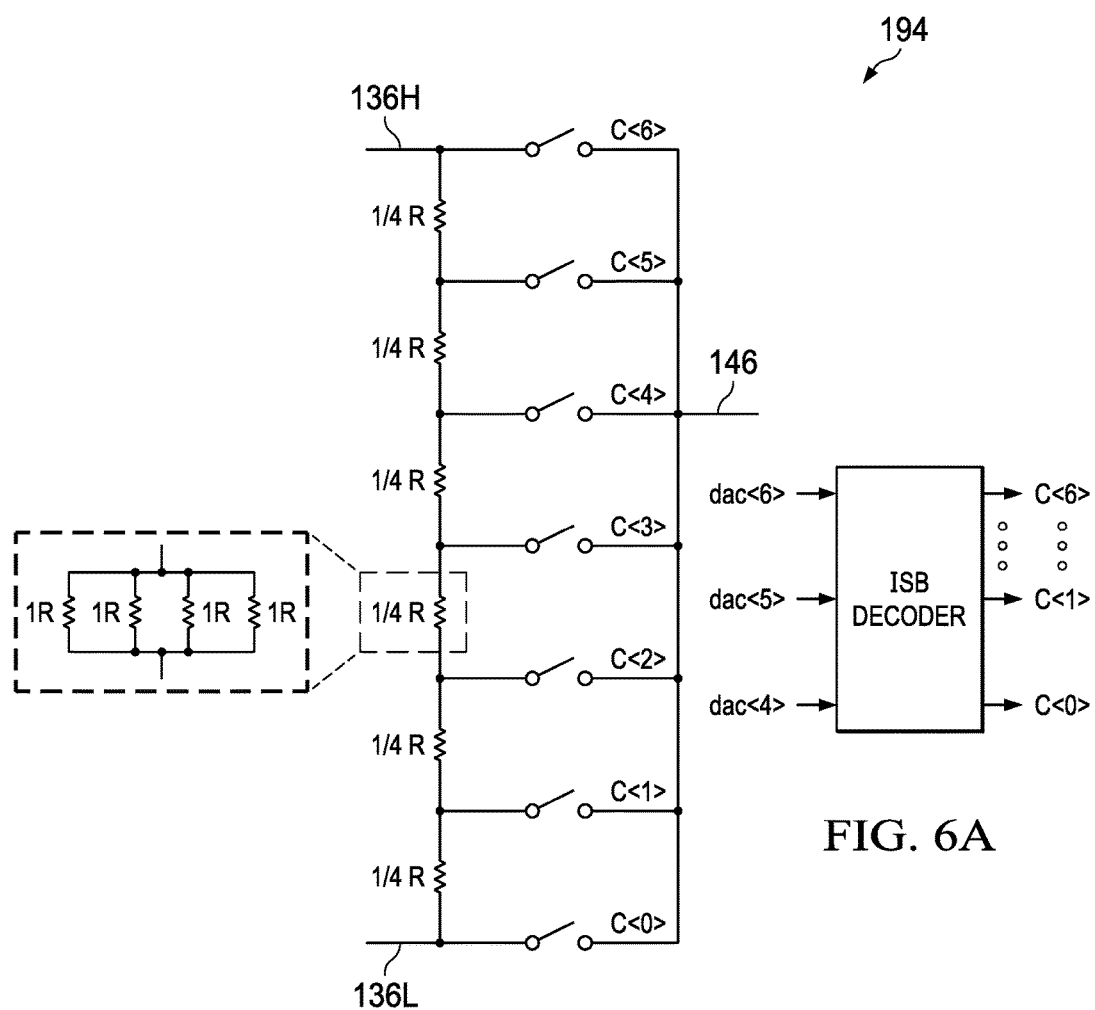
FIGS. 6A-C show an illustrative circuit diagram of a 3-bit ISB resistor ladder for an interpolation RDAC with a 9-bit MSB R-2R DAC that has 3 thermocouple bits in accordance with various examples.
Figure 6B:
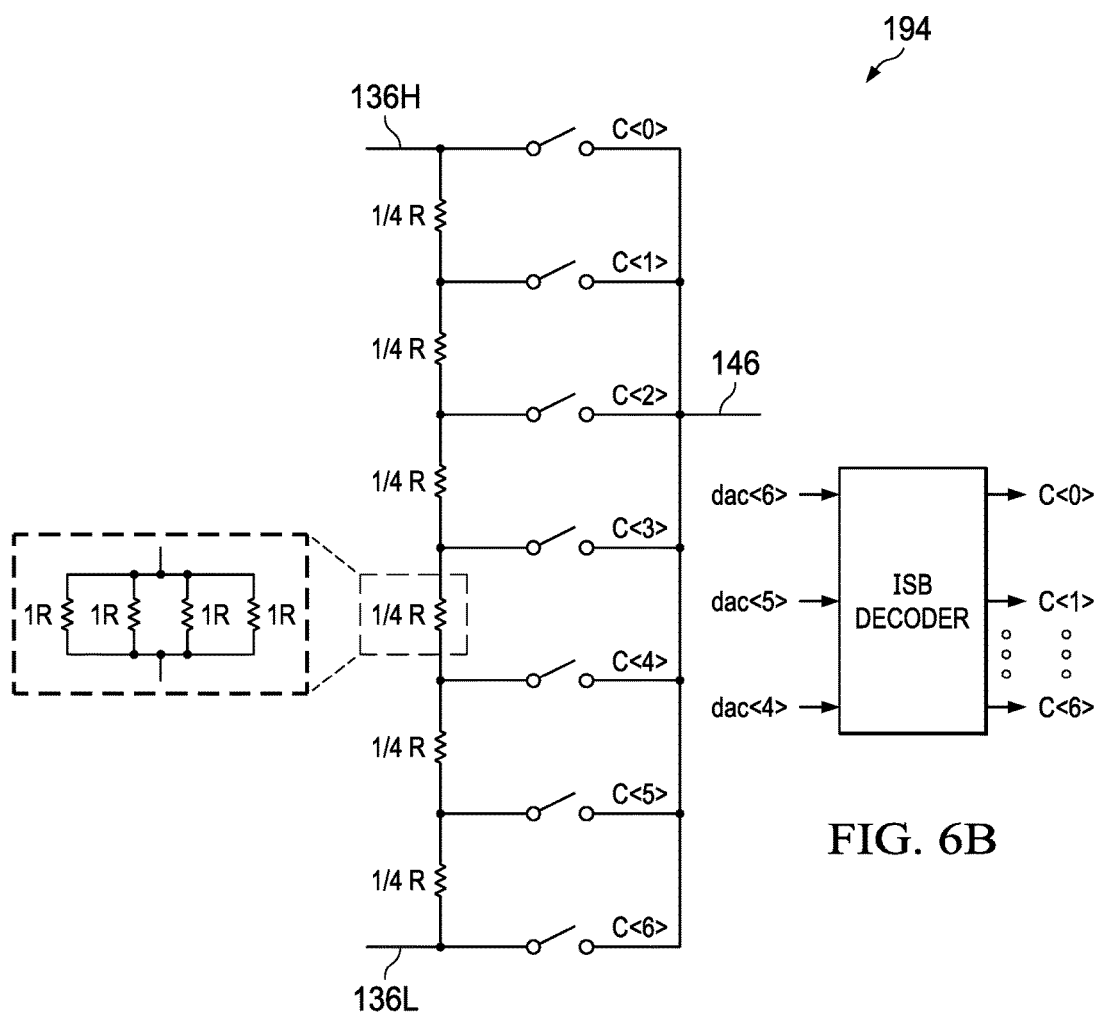
Figure 6C:
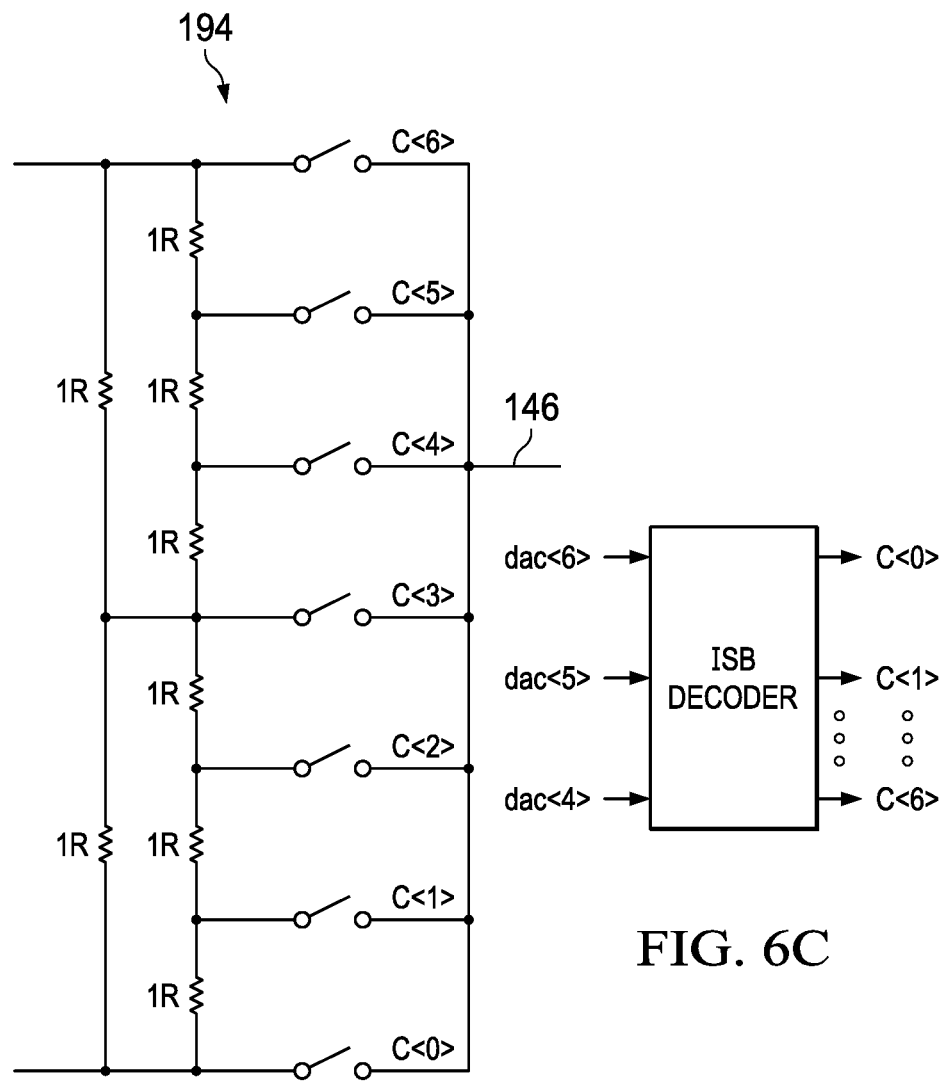

FIGS. 6A-C show an illustrative circuit diagram of a 3-bit ISB resistor ladder 194 for the interpolation RDAC 108 with a 9-bit MSB R-2R DAC 192 that has 3 thermocouple bits as shown in FIG. 3 in accordance with various examples. The example ISB resistor ladder 194 shown in FIGS. 6A-C operates in a similar manner as the ISB resistor ladder 194 shown in FIGS. 5A-B. However, the example ISB resistor ladder 194 in FIGS. 6A-C includes only 6 resistor elements. For example, the decoder of FIGS. 6A and 6B, in an embodiment, generates 7 voltage levels to generate the 1-7 LSB values utilizing the chopper switching circuit 316 of FIGS. 4A-4B and then to generate the 0 LSB or 8 LSB value utilizing the chopper switching circuit 316 of FIGS. 4C-D to generate a 0-7 LSB or 1-8 LSB analog interpolated signal 146. In the example of FIGS. 6A-B, each of the resistor elements have a resistance of ¼ R (a quarter of a unity resistor and/or 4 unity resistors in parallel). Therefore, the output of the example ISB resistor ladder 194 shown in FIGS. 6A-B provides no LSB shift to generate the analog interpolated signal 146. The example shown in FIG. 6A is for a circuit in which the chop 144 is LOW while the example shown in FIG. 6B is for a circuit in which the chop 144 is HIGH.

In some embodiments, the decoder of FIGS. 6A and 6B is not a general decoder (e.g., 3-8 decoder). The table below shows an example of the decoding and ideal analog interpolated signal 146 that can be generated by the resistor ladder 194 as shown in FIGS. 6A-B from 0~4095.

FIG. 6C generates the same output as FIG. 6A, but with fewer actual resistors. As discussed above, the resistor ladder 194 of FIGS. 6A-C includes a resistance of 6R. In FIGS. 6A-B, 24 unity resistors can be utilized to generate the 6R resistance. However, in FIG. 6C, 8 unity resistors can be utilized to generate the 6R resistance and generate the same analog interpolated signal 146.

Figure 7:
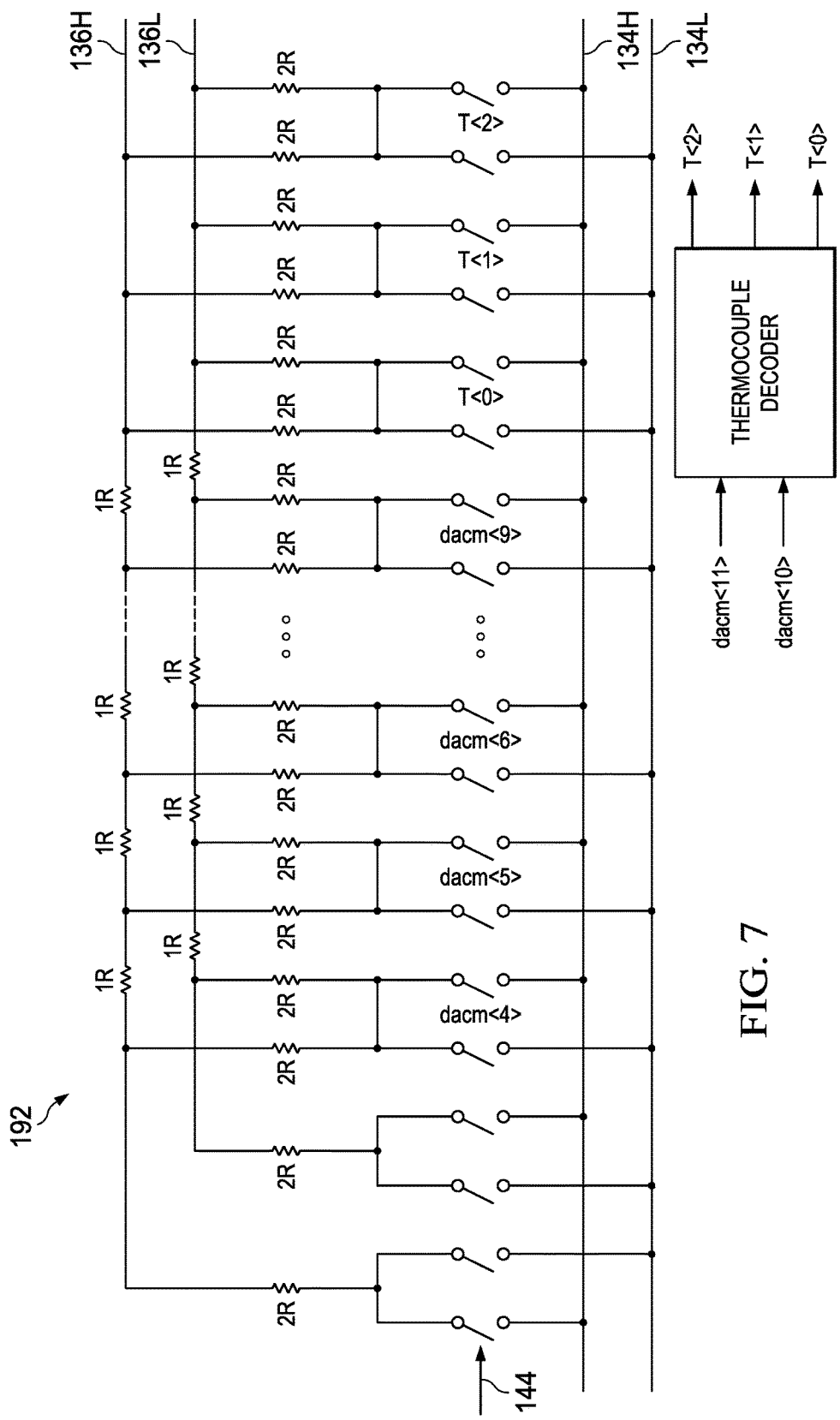
FIG. 7 shows an illustrative circuit diagram of an 8-bit MSB R-2R DAC for an interpolation RDAC of a segmented DAC circuit in accordance with various examples.

FIG. 7 shows an illustrative circuit diagram of an 8-bit MSB R-2R DAC 192 for the interpolation RDAC 108 of the segmented DAC circuit 100 in accordance with various examples. The example 8-bit R-2R DAC 192 works in a similar manner as the 9-bit R-2R DAC 192 illustrated in FIG. 3. However, the 8-bit R-2R DAC utilizes, in an embodiment, 8 bits for the MSB 126M and a 2 bit thermal decode. In other words, the 8-bit R-2R DAC 192 shown in FIG. 7 is a 2-bit thermal decode with a 6-bit binary decode. In other embodiments, more or less bits may be used for the thermal decode.

The number of thermocouple bits that are decoded in the 8-bit MSB R-2R DAC 192, in some embodiments, corresponds with and/or determines the total resistance in the resistor ladder 194. The table below shows the total resistance utilized by the resistor ladder 194 for 4-bit interpolation in conjunction with the 8-bit MSB R-2R DAC 192:

| Chop | dacm<6> | dacm<5> | dacm<4> | C<6> | C<5> | C<4> | C<3> | C<2> | C<1> | C<0> | Ideal Signal 146 |
|---|---|---|---|---|---|---|---|---|---|---|---|
| 0 | 0 | 0 | 0 | 0 | 0 | 0 | 0 | 0 | 0 | 1 | 0 * LSB |
| 0 | 0 | 0 | 1 | 0 | 0 | 0 | 0 | 0 | 1 | 0 | 1 * LSB |
| 0 | 0 | 1 | 0 | 0 | 0 | 0 | 0 | 1 | 0 | 0 | 2 * LSB |
| 0 | 0 | 1 | 1 | 0 | 0 | 0 | 1 | 0 | 0 | 0 | 3 * LSB |
| 0 | 1 | 0 | 0 | 0 | 0 | 1 | 0 | 0 | 0 | 0 | 4 * LSB |
| 0 | 1 | 0 | 1 | 0 | 1 | 0 | 0 | 0 | 0 | 0 | 5 * LSB |
| 0 | 1 | 1 | 0 | 1 | 0 | 0 | 0 | 0 | 0 | 0 | 6 * LSB |
| 0 | 1 | 1 | 1 | 0 | 0 | 0 | 0 | 0 | 0 | 0 | 7 * LSB |
| 1 | 0 | 0 | 0 | 1 | 0 | 0 | 0 | 0 | 0 | 0 | 0 * LSB |
| 1 | 0 | 0 | 1 | 0 | 1 | 0 | 0 | 0 | 0 | 0 | 1 * LSB |
| 1 | 0 | 1 | 0 | 0 | 0 | 1 | 0 | 0 | 0 | 0 | 2 * LSB |
| 1 | 0 | 1 | 1 | 0 | 0 | 0 | 1 | 0 | 0 | 0 | 3 * LSB |
| 1 | 1 | 0 | 0 | 0 | 0 | 0 | 0 | 1 | 0 | 0 | 4 * LSB |
| 1 | 1 | 0 | 1 | 0 | 0 | 0 | 0 | 0 | 1 | 0 | 5 * LSB |
| 1 | 1 | 1 | 0 | 0 | 0 | 0 | 0 | 0 | 0 | 1 | 6 * LSB |
| 1 | 1 | 1 | 1 | 0 | 0 | 0 | 0 | 0 | 0 | 0 | 7 * LSB |

| MSB R-2R DAC 192 | | Total Resistance for Resistor Ladder 194 for 4-bit Interpolation |
|---|---|---|
| Thermocouple Bits | Binary Bits | Without 0.5 LSB Shift |
| 0 bit | x bit | 14R |
| 2 bit | x bit | 7R |
| 3 bit | x bit | 3.5R |
| 4 bit | x bit | 1.75R |

Figure 8A:
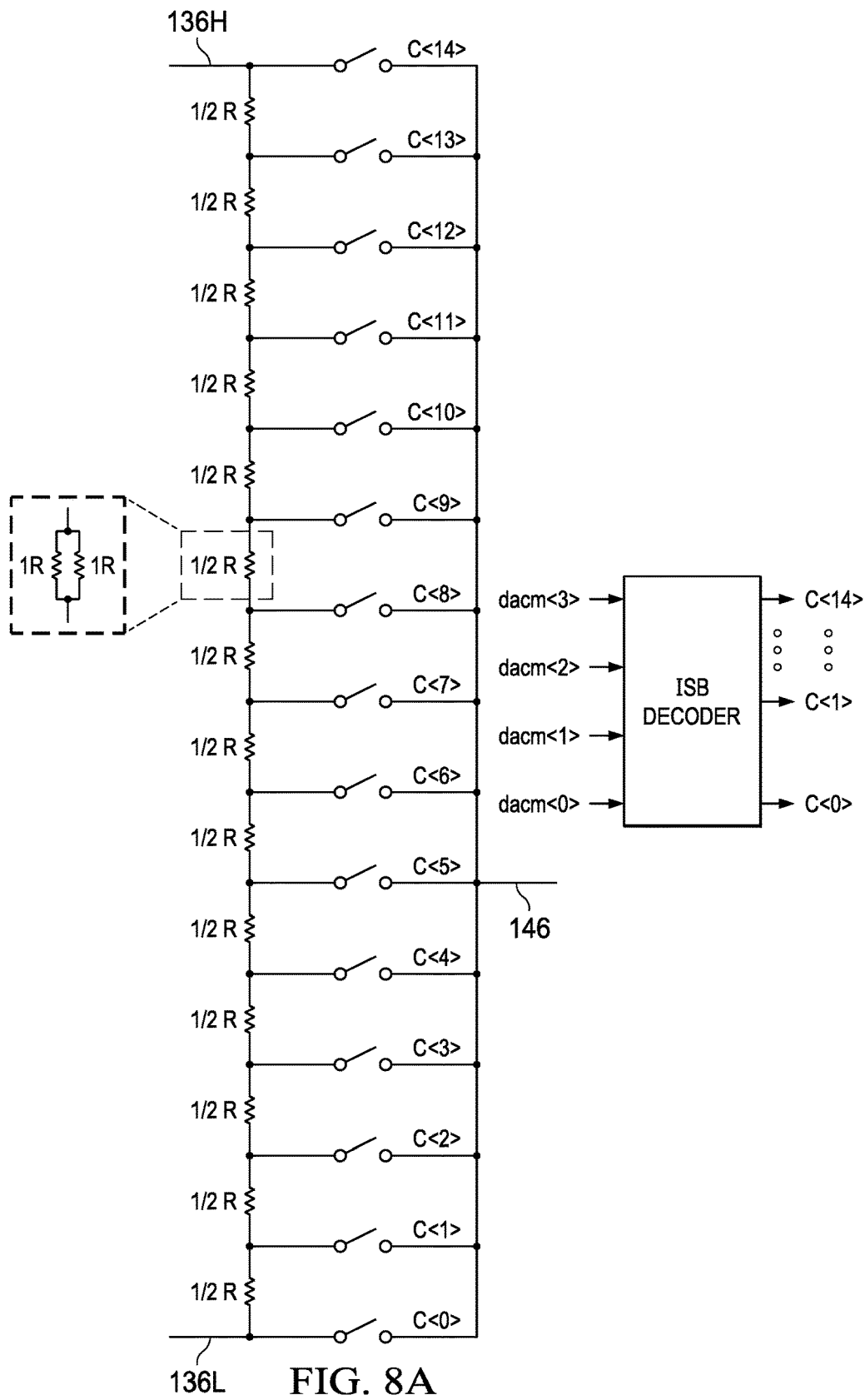
FIGS. 8A-B show illustrative circuit diagrams of a 4-bit ISB resistor ladder for an interpolation RDAC with an 8-bit MSB R-2R DAC that has 2 thermocouple bits in accordance with various examples.
Figure 8B:
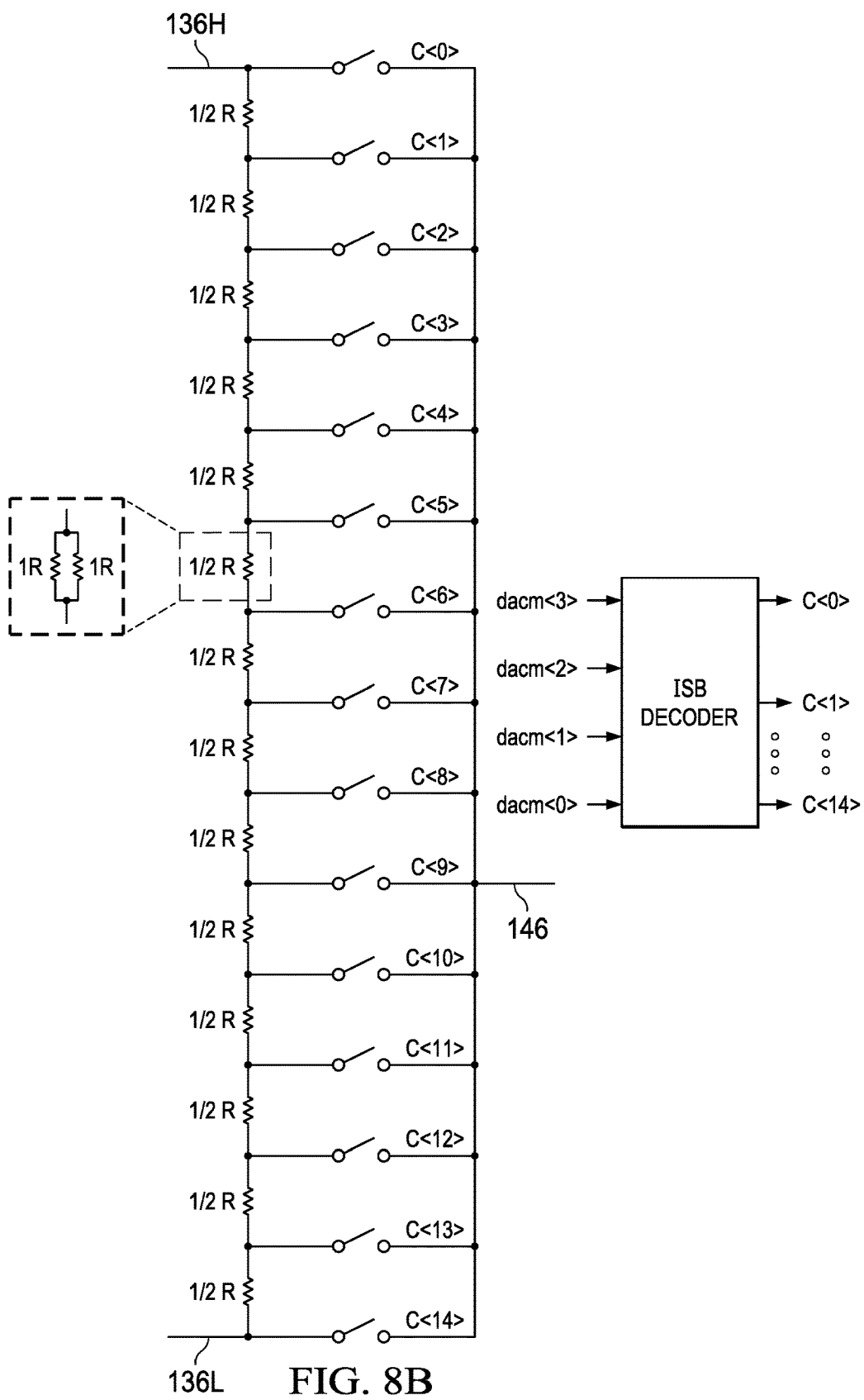

FIGS. 8A-B show an illustrative circuit diagram of a 4-bit ISB resistor ladder 194 for the interpolation RDAC 108 with an 8-bit MSB R-2R DAC 192 that has 2 thermocouple bits as shown in FIG. 7 in accordance with various examples. The example ISB resistor ladder 194 shown in FIGS. 8A-B operates in a similar manner as the ISB resistor ladder 194 shown in FIGS. 5A-B. However, the example ISB resistor ladder 194 in FIGS. 8A-B include 15 taps. In the example of FIGS. 8A-B, each of the resistor elements have a resistance of ½ R (half of a unity resistor and/or 2 unity resistors in parallel). Therefore, the output of the example ISB resistor ladder 194 shown in FIGS. 8A-B provides no LSB shift to generate the analog interpolated signal 146. The example shown in FIG. 8A is for a circuit in which the chop 144 is LOW while the example shown in FIG. 8B is for a circuit in which the chop 144 is HIGH.

In some embodiments, the decoder of FIGS. 8A and 8B is not a general decoder (e.g., a general 4-16 decoder). The table below shows an example of the decoding and ideal analog interpolated signal 146 that can be generated by the resistor ladder 194 as shown in FIGS. 8A-B.

| Chop | dacm<3> | dacm<2> | dacm<1> | dacm<0> | C<14> | C<13> | C<12> | C<11> | C<10> | C<9> | C<8> | C<7> | C<6> | C<5> | C<4> | C<3> | C<2> | C<1> | C<0> | Ideal Signal 146 |
|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 1 | 1 * LSB |
| 0 | 0 | 0 | 0 | 1 | 0 | 0 | 0 | 0 | 0 | 0 | 0 | 0 | 0 | 0 | 0 | 0 | 0 | 0 | 1 | 2 * LSB |
| 0 | 0 | 0 | 1 | 0 | 0 | 0 | 0 | 0 | 0 | 0 | 0 | 0 | 0 | 0 | 0 | 0 | 0 | 1 | 0 | 3 * LSB |
| 0 | 0 | 0 | 1 | 1 | 0 | 0 | 0 | 0 | 0 | 0 | 0 | 0 | 0 | 0 | 0 | 0 | 1 | 0 | 0 | 4 * LSB |
| 0 | 0 | 1 | 0 | 0 | 0 | 0 | 0 | 0 | 0 | 0 | 0 | 0 | 0 | 0 | 1 | 0 | 0 | 0 | 0 | 5 * LSB |
| 0 | 0 | 1 | 0 | 1 | 0 | 0 | 0 | 0 | 0 | 0 | 0 | 0 | 0 | 1 | 0 | 0 | 0 | 0 | 0 | 6 * LSB |
| 0 | 0 | 1 | 1 | 0 | 0 | 0 | 0 | 0 | 0 | 0 | 0 | 0 | 1 | 0 | 0 | 0 | 0 | 0 | 0 | 7 * LSB |
| 0 | 0 | 1 | 1 | 1 | 0 | 0 | 0 | 0 | 0 | 0 | 0 | 1 | 0 | 0 | 0 | 0 | 0 | 0 | 0 | 8 * LSB |
| 0 | 1 | 0 | 0 | 0 | 0 | 0 | 0 | 0 | 0 | 0 | 1 | 0 | 0 | 0 | 0 | 0 | 0 | 0 | 0 | 9 * LSB |
| 0 | 1 | 0 | 0 | 1 | 0 | 0 | 0 | 0 | 0 | 1 | 0 | 0 | 0 | 0 | 0 | 0 | 0 | 0 | 0 | 10 * LSB |
| 0 | 1 | 0 | 1 | 0 | 0 | 0 | 0 | 0 | 1 | 0 | 0 | 0 | 0 | 0 | 0 | 0 | 0 | 0 | 0 | 11 * LSB |
| 0 | 1 | 0 | 1 | 1 | 0 | 0 | 0 | 0 | 0 | 0 | 0 | 0 | 0 | 0 | 0 | 0 | 0 | 0 | 0 | 12 * LSB |
| 0 | 1 | 1 | 0 | 0 | 0 | 0 | 0 | 1 | 0 | 0 | 0 | 0 | 0 | 0 | 0 | 0 | 0 | 0 | 0 | 13 * LSB |
| 0 | 1 | 1 | 0 | 1 | 0 | 0 | 1 | 0 | 0 | 0 | 0 | 0 | 0 | 0 | 0 | 0 | 0 | 0 | 0 | 14 * LSB |
| 0 | 1 | 1 | 1 | 0 | 0 | 1 | 0 | 0 | 0 | 0 | 0 | 0 | 0 | 0 | 0 | 0 | 0 | 0 | 0 | 15 * LSB |
| 0 | 1 | 1 | 1 | 1 | 1 | 0 | 0 | 0 | 0 | 0 | 0 | 0 | 0 | 0 | 0 | 0 | 0 | 0 | 0 | 16 * LSB |
| 1 | 0 | 0 | 0 | 0 | 1 | 0 | 0 | 0 | 0 | 0 | 0 | 0 | 0 | 0 | 0 | 0 | 0 | 0 | 0 | 1 * LSB |
| 1 | 0 | 0 | 0 | 1 | 0 | 1 | 0 | 0 | 0 | 0 | 0 | 0 | 0 | 0 | 0 | 0 | 0 | 0 | 0 | 2 * LSB |
| 1 | 0 | 0 | 1 | 0 | 0 | 0 | 1 | 0 | 0 | 0 | 0 | 0 | 0 | 0 | 0 | 0 | 0 | 0 | 0 | 3 * LSB |
| 1 | 0 | 0 | 1 | 1 | 0 | 0 | 0 | 1 | 0 | 0 | 0 | 0 | 0 | 0 | 0 | 0 | 0 | 0 | 0 | 4 * LSB |
| 1 | 0 | 1 | 0 | 0 | 0 | 0 | 0 | 0 | 1 | 0 | 0 | 0 | 0 | 0 | 0 | 0 | 0 | 0 | 0 | 5 * LSB |
| 1 | 0 | 1 | 0 | 1 | 0 | 0 | 0 | 0 | 0 | 1 | 0 | 0 | 0 | 0 | 0 | 0 | 0 | 0 | 0 | 6 * LSB |
| 1 | 0 | 1 | 1 | 0 | 0 | 0 | 0 | 0 | 0 | 0 | 0 | 0 | 0 | 0 | 0 | 0 | 0 | 0 | 0 | |
| 1 | 0 | 1 | 1 | 1 | 0 | 0 | 0 | 0 | 0 | 0 | 0 | 0 | 0 | 0 | 0 | 0 | 0 | 0 | 0 | |
| 1 | 1 | 0 | 0 | 0 | 0 | 0 | 0 | 0 | 0 | 0 | 0 | 0 | 0 | 0 | 0 | 0 | 0 | 0 | 0 | |
| 1 | 1 | 0 | 0 | 1 | 0 | 0 | 0 | 0 | 0 | 0 | 0 | 0 | 0 | 0 | 0 | 0 | 0 | 0 | 0 | |
| 1 | 1 | 0 | 1 | 0 | 0 | 0 | 0 | 0 | 0 | 0 | 0 | 0 | 0 | 0 | 0 | 0 | 0 | 0 | 0 | |
| 1 | 1 | 0 | 1 | 1 | 0 | 0 | 0 | 0 | 0 | 0 | 0 | 0 | 0 | 0 | 0 | 0 | 0 | 0 | 0 | |
| 1 | 1 | 1 | 0 | 0 | 0 | 0 | 0 | 0 | 0 | 0 | 0 | 0 | 0 | 0 | 0 | 0 | 0 | 0 | 0 | |
| 1 | 1 | 1 | 0 | 1 | 0 | 0 | 0 | 0 | 0 | 0 | 0 | 0 | 0 | 0 | 0 | 0 | 0 | 0 | 0 | |
| 1 | 1 | 1 | 1 | 0 | 0 | 0 | 0 | 0 | 0 | 0 | 0 | 0 | 0 | 0 | 0 | 0 | 0 | 0 | 0 | |
| 1 | 1 | 1 | 1 | 1 | 0 | 0 | 0 | 0 | 0 | 0 | 0 | 0 | 0 | 0 | 0 | 0 | 0 | 0 | 0 | |

-continued

| | | | | | | | | | | | |
|---|---|---|---|---|---|---|---|---|---|---|---|
| 0 | 0 | 1 | 0 | 0 | 0 | 0 | 0 | 0 | 0 | 0 | 7 * LSB |
| 0 | 0 | 0 | 1 | 0 | 0 | 0 | 0 | 0 | 0 | 0 | 8 * LSB |
| 0 | 0 | 0 | 0 | 1 | 0 | 0 | 0 | 0 | 0 | 0 | 9 * LSB |
| 0 | 0 | 0 | 0 | 0 | 1 | 0 | 0 | 0 | 0 | 0 | 10 * LSB |
| 0 | 0 | 0 | 0 | 0 | 0 | 1 | 0 | 0 | 0 | 0 | 11 * LSB |
| 0 | 0 | 0 | 0 | 0 | 0 | 0 | 1 | 0 | 0 | 0 | 12 * LSB |
| 0 | 0 | 0 | 0 | 0 | 0 | 0 | 0 | 1 | 0 | 0 | 13 * LSB |
| 0 | 0 | 0 | 0 | 0 | 0 | 0 | 0 | 0 | 1 | 0 | 14 * LSB |
| 0 | 0 | 0 | 0 | 0 | 0 | 0 | 0 | 0 | 0 | 1 | 15 * LSB |
| 0 | 0 | 0 | 0 | 0 | 0 | 0 | 0 | 0 | 0 | 1 | 16 * LSB |

Figure 9A:
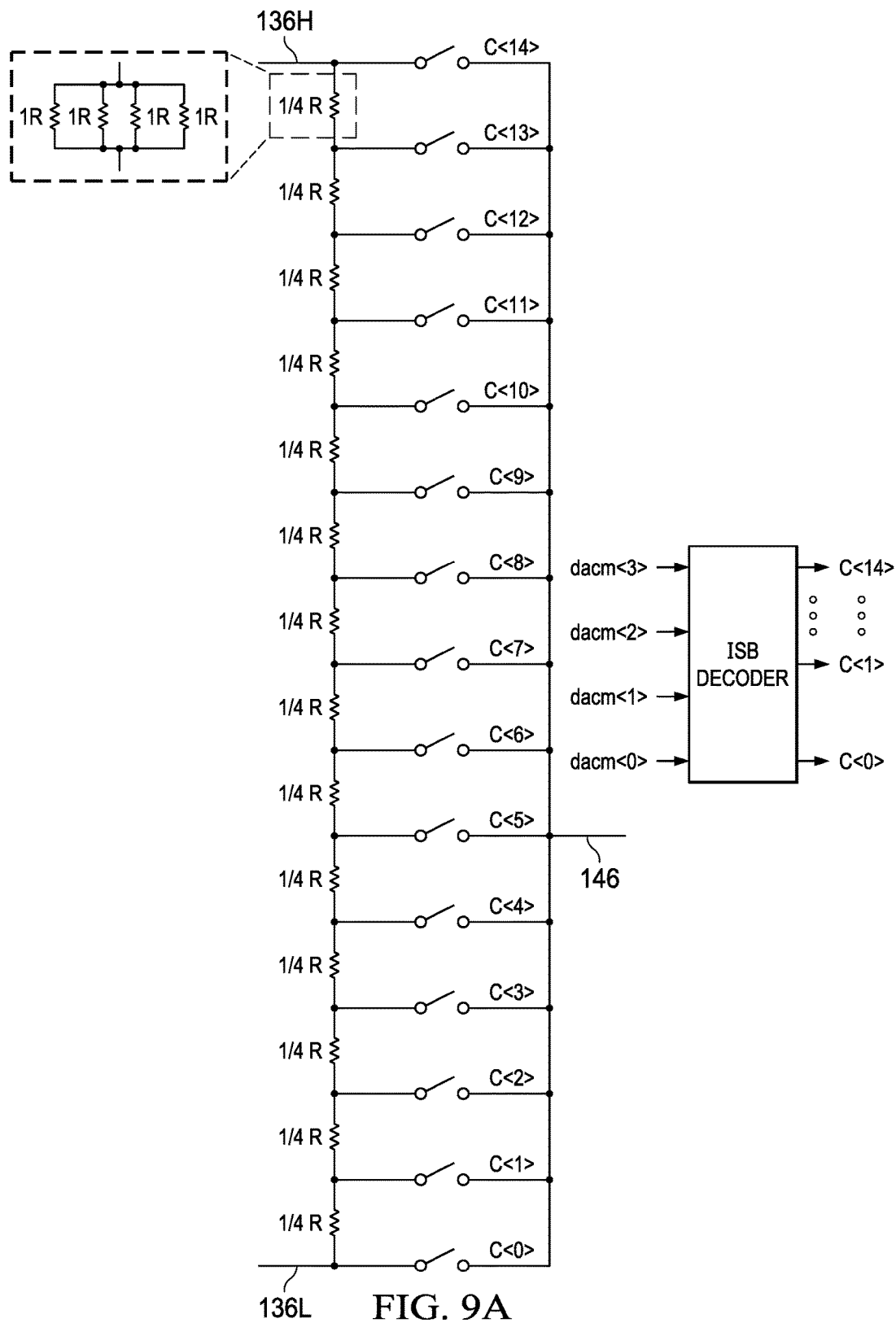
FIGS. 9A-B show illustrative circuit diagrams of a 4-bit ISB resistor ladder for an interpolation RDAC with an 8-bit MSB R-2R DAC that has 3 thermocouple bits in accordance with various examples.
Figure 9B:
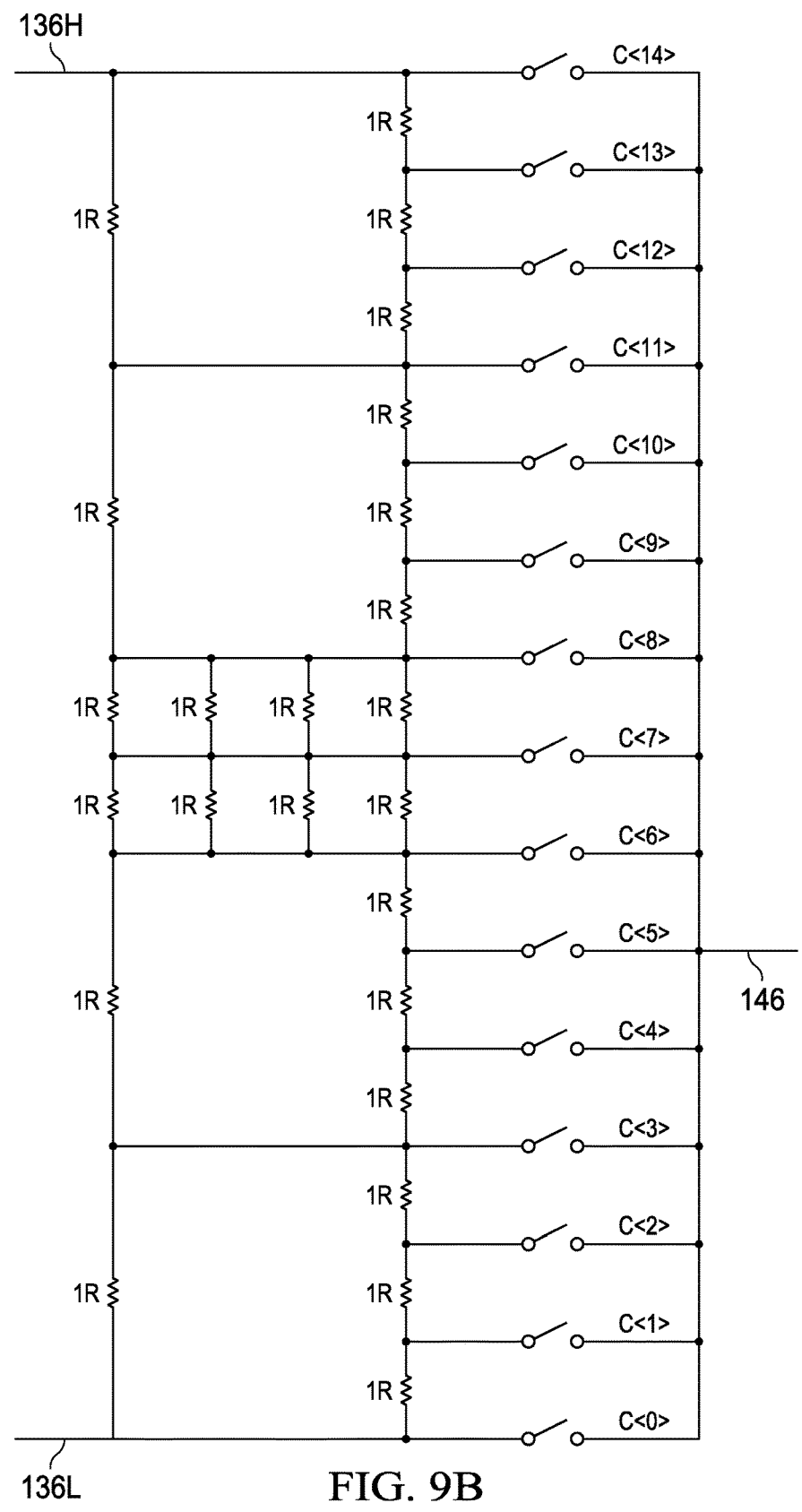

FIGS. 9A-B show illustrative circuit diagrams of a 4-bit ISB resistor ladder 194 for the interpolation RDAC 108 with an 8-bit MSB R-2R DAC 192 that has 3 thermocouple bits in accordance with various examples. The example ISB resistor ladder 194 shown in FIGS. 6A-C operates in a similar manner as the ISB resistor ladder 194 shown in FIGS. 5A-B. However, in the example of FIG. 9A, each of the resistor elements have a resistance of ¼ R (a quarter of a unity resistor and/or 4 unity resistors in parallel). Therefore, the output of the example ISB resistor ladder 194 shown in FIG. 9A provides no LSB shift to generate the analog interpolated signal 146. The example shown in FIG. 9A is for a circuit in which the chop 144 is LOW.

FIG. 9B generates the same output as FIG. 9A, but with fewer actual resistors. As discussed above, the resistor ladder 194 of FIGS. 6A-C includes a resistance of 6R. In FIG. 9A, 56 unity resistors can be utilized to generate the 3.5R resistance. However, in FIG. 9B, 24 unity resistors can be utilized to generate the 3.5R resistance and generate the same analog interpolated signal 146.

The interpolation RDAC 108 advantageously employs an MSB R-2R DAC 192 to convert the first subword MSB 126M to the first analog output signal VH 136H, VL 136L using significantly fewer switches than traditional resistor ladder MSB DACs. The interpolation RDAC 108 also provides interpolation through an ISB resistor ladder 194 which reduces the need for an interpolation amplifier. Thus, the calibration memory requirement is reduced and the complexity of a conventional system introduced by an interpolation amplifier is also reduced. The SDM 196 can be selectively employed to achieve additional resolution of the segmented DAC circuit 100, and no additional calibration DAC is required to achieve 16-bit resolution. The reduction in switches and memory capacity, as well as the reduction in complexity, reduces circuit area and power consumption while increasing speed compared with conventional DACs.

Figure 10A:
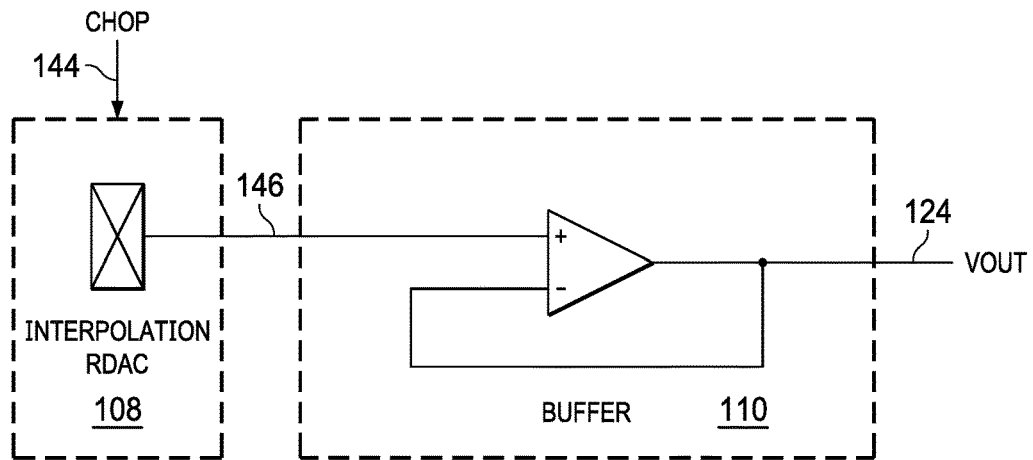
FIG. 10A shows an illustrative chopper functionality in a segmented DAC circuit in accordance with various examples.
Figure 10B:
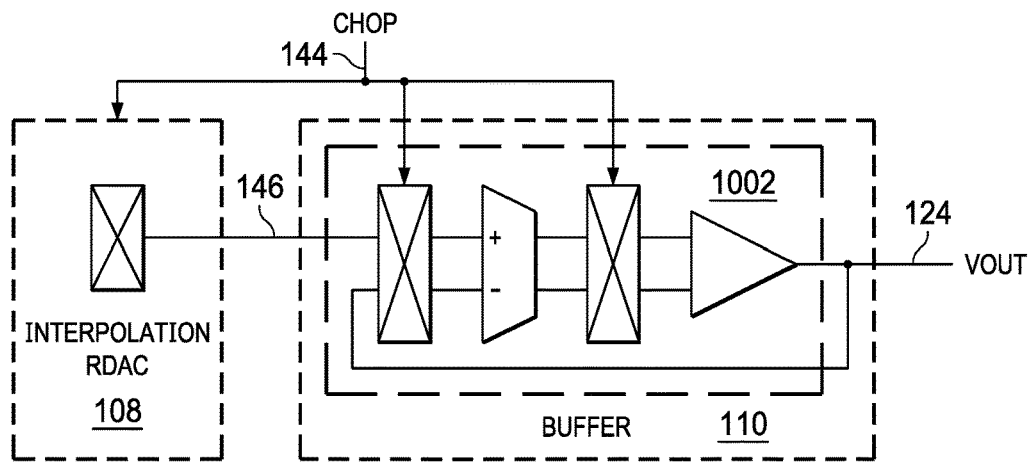
FIG. 10B shows an illustrative chopper functionality in a segmented DAC circuit in accordance with various examples.
Figure 10C:
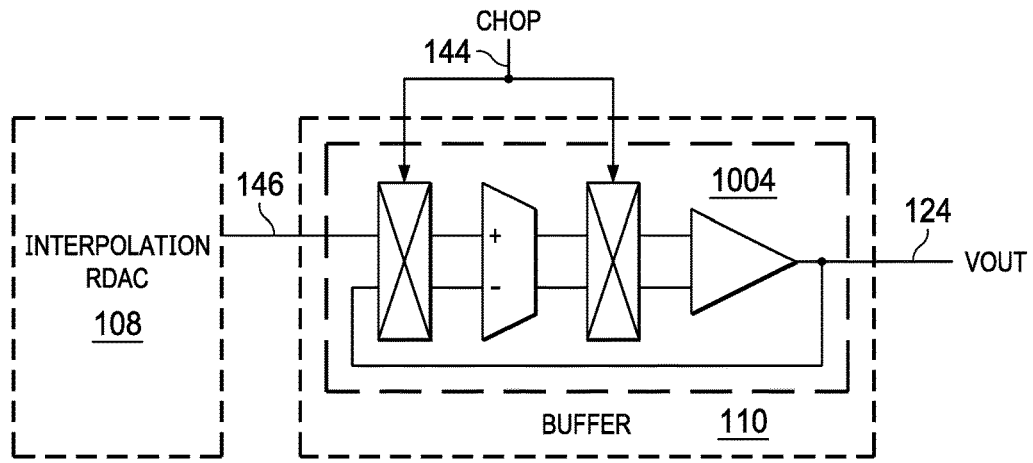
FIG. 10C shows an illustrative chopper functionality in a segmented DAC circuit in accordance with various examples.

FIGS. 10A-C show illustrative chopper functionality in the segmented DAC circuit 100 in accordance with various examples. FIG. 10A illustrates application of the chop signal 144 to the interpolation RDAC 108. The chop signal 144 causes the interconnection of the first analog output signals 136 to swap between the output of the MSB R-2R DAC 192 and the ISB resistor ladder 194. More particularly, the chop signal 144 is provided, in an embodiment, to the input of the MSB R-2R DAC 192 to switch VH 136H and VL 136L provided to the input of the ISB resistor ladder 194.

FIG. 10B illustrates application of the chop signal 144 to the interpolation RDAC 108 and the buffer amplifier 110. Like in the example of FIG. 10A, in the example of FIG. 6B, the chop signal 144 is provided, in an embodiment, to the input of the MSB R-2R DAC 192 to switch VH 136H and VL 136L provided to the input of the ISB resistor ladder 194. Additionally, the buffer amplifier 110 includes a chopper amplifier 1002 to break up the analog interpolated signal 146 received from the interpolation RDAC 108 to be processed as an AC signal. Once processed, the signal is integrated back to a DC signal at the output to generate VOUT 124.

FIG. 10C illustrates application of the chop signal 144 to the buffer amplifier 110. Like in the example of FIG. 10B, in the example of FIG. 10C, the buffer amplifier 110 includes a chopper amplifier 1004 to break up the analog interpolated signal 146 received from the interpolation RDAC 108 to be processed as an AC signal. Once processed, the signal is integrated back to a DC signal at the output to generate VOUT 124.

The segmented DAC circuit 100 using the interpolation RDAC 108 (including the MSB R-2R DAC 192 of FIGS. 3 and 7 and the ISB resistor ladder 194 of FIGS. 4A-6C and 8A-9B) also facilitates reduced calibration memory requirements and shortens factory calibration times. In certain examples, high performance for low integral nonlinearity errors (INL) and differential nonlinearity errors (DNL) can be achieved. For a 16-bit case, for example, INL and DNL of less than +/−1LSB can be achieved over a +/−32LSB calibration range with +/−¼ calibration step. Calibration memory in one 16-bit example using the 12-bit MSB DAC 120 requires only 12×8-bits of memory 108 for the MSB calibration with chopper functionality, 12×8-bits of memory for the MSB calibration without chopper functions and 16×6-bits of memory for the LSB calibration. No additional calibration DAC is used in this example.

FIG. 11 shows an illustrative flow diagram of a method 1100 for calibrating a DAC in accordance with various examples. Though depicted sequentially as a matter of convenience, at least some of the actions shown can be performed in a different order and/or performed in parallel. Additionally, some embodiments may perform only some of the actions shown. In some embodiments, at least some of the operations of the method 1100, as well as other operations described herein, are performed by the segmented DAC circuit 100. More particularly, at least some of the operations of the method 1100, as well as other operations described herein, are performed by the decoder 102, the calibration circuit 104, the calibration and DEM circuit (including the SDM 196), the interpolation DAC 108 (including the MSB R-2R DAC 192 and/or the ISB resistor ladder 194), the buffer amplifier 110, the OEM memory 112, and/or the multiplexers 114, 116, and implemented in logic.

The method 1100 provides calibration for a DAC circuit that converts a K-bit digital input signal (e.g., CODE 122 above) that includes an M-bit first subword MSB that includes a most significant bit of the digital input signal, an I-bit second subword ISB, and an L-bit third subword LSB that includes the least significant bit of the digital input signal. The method 1100 in an embodiment is implemented during manufacturing of the segmented DAC circuit 100. The calibration method 1100, moreover, provides significant advantages with respect to calibration memory utilization and calibration time compared with traditional calibration processes. In contrast to the traditional calibration process, the method 1100 does not require trimming of a calibration DAC, and can be implemented using significantly less calibration memory than traditional techniques.

The method 1100 begins in block 1102 with measuring DAC output voltages, including output voltages of an R-2R DAC for a corresponding set of values of a first subword, measuring output voltages of a resistor ladder for a corresponding set of values of a second subword, and measuring output voltages of an SDM for a corresponding set of third subword values. At 1110, the method includes calculating an output voltage value of a segmented DAC based on the measured output voltages. At 1120, the method provides for calculating calibration codes for the R-2R DAC, the resistor ladder, and the SDM, as well as calculating and storing a K-bit calibration code for the DAC circuit based on the calibration codes. Thereafter at 1130, the method includes calculating a calibrated DAC INL and DNL. The method 1100 is described in the context of a 16-bit segmented DAC circuit 100 as described above, including an M=9-bit first subword MSB, an I=3-bit second subword ISB and an L=4-bit third subword LSB, but the method 1100 can be used in connection with calibration of other segmented DAC systems having other values for M, I and/or L.

The output voltage measurements at 1102 includes, in an embodiment, blocks 1104-1108. In block 1104, the method 700 begins with measuring M+1 output voltages VH, VL, such as VH 136H and VL 136L, of an M-bit MSB R-2R DAC, such as MSB R-2R DAC 192, for a corresponding set of M+1 values of the first subword MSB. In the illustrated example, the set of M+1 values of the first subword MSB includes a first set with all bits set to 0 and M values in which only a single bit is set to 1. Because M+1 output voltages VH, VL are measured, 10 values of the first subword MSB are evaluated for measurements at 1104. This significantly saves measurement time compared with conventional resistor ladder DACs of a segmented DAC system. The method 1100 continues in block 1106 with measuring $2^I$ (e.g., 8) output voltages, such as analog interpolated signal 146, of the I-bit ISB resistor ladder, such as ISB resistor ladder 194, for a corresponding set of $2^I$ unique values of the second subword ISB. For example, in block 1108, the method 1100 continues with measuring $2^L$ (e.g., 16) output voltages, such as ICODE 138, for the L-bit SDM, such as SDM 196, for a corresponding set of $2^L$ unique values of the third subword LSB.

The calculating at 1110 includes, in an embodiment, blocks 1112-1114. In block 1112, the method 1100 continues with calculating a K-bit output voltage value DAC VOUT, such as VOUT 124, based on the measured output voltages VH, VL, the analog interpolated signal, and ICODE. In block 1114, the method 1100 continues with calculating an INL and a DNL based on the K-bit output voltage value DAC VOUT computed at 1112.

The processing at 1120 includes, in an embodiment, blocks 1122-1128. In block 1122, the method 1100 continues with calculating calibration code CAL_MSB for the MSB R-2R DAC. In an embodiment, calculating calibration code CAL_MSB includes calculating the 9-bit MSB calibration code code_9_bits_MSB according to the following formula: code_9_bits_MSB=(VH-VL_ideal)/(0.25*LSB), for ISB=VREF/512. The method 1100 continues in block 1124 with calculating calibration code CAL_ISB for the ISB resistor ladder. In an embodiment, calculating calibration code CAL_ISB includes calculating a 3-bit ISB calibration code "code_3_bits_ISB" according to the following formula: code_3_bits_ISB=(analog interpolated signal−an ideal analog interpolated signal)/(0.25*LSB). In block 1126, the method 1100 continues with calculating calibration code CAL_LSB for the SDM. The method 1100 continues in block 1128 with calculating a K-bit calibration code for the segmented DAC circuit 100 based on the calibration codes CAL_MSB, CAL_ISB, CAL_LSB and storing the K-bit calibration code in calibration memory, such as calibration memory 104. The calibrated 16-bit DAC INL and DNL values can then be calculated at 1130.

FIG. 12 shows an illustrative flow diagram of a method 1200 of converting a digital input signal into a corresponding analog output signal in accordance with various examples. Though depicted sequentially as a matter of convenience, at least some of the actions shown can be performed in a different order and/or performed in parallel. Additionally, some embodiments may perform only some of the actions shown. In some embodiments, at least some of the operations of the method 1200, as well as other operations described herein, are performed by the segmented DAC circuit 100. More particularly, at least some of the operations of the method 1200, as well as other operations described herein, are performed by the decoder 102, the calibration circuit 104, the calibration and DEM circuit (including the SDM 196), the interpolation DAC 108 (including the MSB R-2R DAC 192 and/or the ISB resistor ladder 194), the buffer amplifier 110, the OEM memory 112, and/or the multiplexers 114, 116, and implemented in logic.

The method 1200 begins in block 1202 with receiving a first subword of a digital input signal. The first subword includes an integer number M bits that include a MSB of the digital input signal. For example, the M-BIT MSB R-2R DAC 192 can receive first subword MSB 126M from a decoder that receives the original digital signal (e.g., CODE 122). As discussed above, in some embodiments, the first subword is 9 bits. In block 1204, the method 1200 continues with generating, by an R-2R DAC, an analog output signal with a voltage representative of the first subword. For example, the MSB R-2R DAC 192 can generate VH 136H and VL 136L as a differential signal that is representative of the first subword MSB 126M.

The method 1200 continues in block 1206 with generating, by a resistor ladder, an analog signal based on the analog output signal and a second subword of the digital input signal. The second subword includes an integer number I bits that include an ISB of the digital input signal. For example, the I-bit ISB resistor ladder 194 can receive VH 136H, VL 136L, and the second subword ISB 126I. As discussed above, in some embodiments, the second subword is 3 bits. The ISB resistor ladder, utilizing VH 136H, VL 136L, and second subword ISB 126I, can generate the analog interpolated signal 146. In block 1208, the method 1200 continues with generating, by a buffer amplifier, an analog output signal based on the analog interpolated signal. For example, the buffer amplifier 110 can receive the analog interpolated signal 146 and generate VOUT 124 which, in some embodiments, is a unity voltage gain with higher current version of the analog interpolated signal 146.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A segmented digital-to-analog converter (DAC) circuit, comprising:
   an interpolation resistor DAC (RDAC) including:
   a resistor-two-resistor (R-2R) DAC configured to receive a first subword having an integer number M bits that include a most significant bit (MSB) of a digital input signal and generate an analog output signal with a voltage representative of the first subword, wherein the R-2R DAC includes:
   an R-2R circuit that includes a plurality of resistors; and
   a first switching circuit connected to the R-2R circuit at a plurality of tap nodes, the first switching circuit including a plurality of switches individually connected between a corresponding one of the tap nodes and a reference voltage; and
   a resistor ladder configured to receive the analog output signal and a second subword that has an integer number I bits that include an intermediate significant bit (ISB) of the digital input signal and generate an analog interpolated signal; and
   a buffer amplifier configured to receive the analog interpolated signal and generate an output signal for the segmented DAC.

2. The segmented DAC of claim 1, wherein each of the plurality of resistors is based on a unity resistor value.

3. The segmented DAC of claim 1, wherein the R-2R DAC further includes:
   an ordered element matching (OEM) circuit that includes a plurality of OEM resistor elements;
   an OEM switching circuit that includes a plurality of OEM switches configured to selectively connect a corresponding one of the OEM resistor elements between the reference voltage and the analog output signal based on an OEM code; and
   a thermocouple decoder configured to generate the OEM code based on a plurality of least significant bits of the first subword.

4. The segmented DAC of claim 1, wherein the R-2R DAC further includes:
   a chopper circuit that includes a plurality of chopper resistors; and
   a chopper switching circuit that includes a plurality of chopper switches configured to selectively connect a corresponding one of the chopper resistors to the reference voltage based on a chopper code.

5. The segmented DAC of claim 1, wherein the resistor ladder includes:
   a plurality of resistor elements connected in series with one another to define a plurality of tap nodes between adjacent ones of the resistor elements; and
   a switching circuit that includes a plurality of switches configured to selectively connect a corresponding one of the tap nodes to an output of the resistor ladder to generate the analog interpolated signal.

6. The segmented DAC of claim 1, further comprising a calibration circuit configured to generate a calibration code from calibration data based on the digital input signal and generate a modulator code based on the calibration code and the second subword and a third subword having an integer number L bits that includes a least significant bit (LSB) of the digital input signal.

7. The segmented DAC of claim 6, wherein the calibration circuit is configured to store a first set of K×M bits of calibration data for the second subword and a second set of K×M bits of calibration data for the third subword.

8. The segmented DAC of claim 1, wherein the buffer amplifier includes a chopper circuit configured to break up the analog interpolated signal received from the interpolation RDAC to be processed as an AC signal and integrate the AC signal back to a DC signal at an output of the buffer amplifier to generate the output signal for the segmented DAC.

9. The interpolation DAC of claim 1, wherein the integer number M bits is 9 bits and the integer number I bits is 3 bits.

10. An interpolation resistor digital-to-analog converter (RDAC) comprising:
    a resistor-two-resistor (R-2R) DAC configured to receive a first subword having an integer number M bits that include a most significant bit (MSB) of a digital input signal and generate an analog output signal with a voltage representative of the first subword; and
    a resistor ladder configured to receive the analog output signal and a second subword that has an integer number I bits that include an intermediate significant bit (ISB) of the digital input signal and generate an analog interpolated signal;
    wherein the R-2R DAC includes a R-2R circuit that includes a plurality of resistors, and a first switching circuit connected to the R-2R circuit at a plurality of tap nodes, the first switching circuit including a plurality of switches individually connected between a corresponding one of the tap nodes and a reference voltage.

11. The interpolation resistor DAC of claim 10, wherein the R-2R DAC further includes:
    an ordered element matching (OEM) circuit that includes a plurality of OEM resistor elements;
    an OEM switching circuit that includes a plurality of OEM switches configured to selectively connect a corresponding one of the OEM resistor elements between the reference voltage and the analog output signal based on an OEM code; and
    a thermocouple decoder configured to generate the OEM code based on a plurality of least significant bits of the first subword.

12. The interpolation resistor DAC of claim 11, wherein the R-2R DAC further includes:
    a chopper circuit that includes a plurality of chopper resistors; and
    a chopper switching circuit that includes a plurality of chopper switches configured to selectively connect a corresponding one of the chopper resistors to the reference voltage based on a chopper code.

13. The interpolation resistor DAC of claim 10, wherein the resistor ladder includes:
    a plurality of resistor elements connected in series with one another to define a plurality of tap nodes between adjacent ones of the resistor elements; and
    a switching circuit that includes a plurality of switches configured to selectively connect a corresponding one of the tap nodes to an output of the resistor ladder to generate the analog interpolated signal.

14. The interpolation resistor DAC of claim 13, wherein a number of resistor elements in the plurality of resistor elements is 7.

15. The interpolation resistor DAC of claim 14, wherein each of the resistor elements includes two parallel resistors, each with a resistance equal to a unity resistor value.

16. The interpolation resistor DAC of claim 13, wherein a number of resistor elements in the plurality of resistor elements is 6.

17. The interpolation resistor DAC of claim 16, wherein each of the resistor elements includes four parallel resistors, each with a resistance equal to a unity resistor value.

18. A segmented digital-to-analog converter (DAC) circuit, comprising:
an interpolation resistor DAC (RDAC) including:
a resistor-two-resistor (R-2R) DAC configured to receive a first subword having an integer number M bits that include a most significant bit (MSB) of a digital input signal and generate an analog output signal with a voltage representative of the first subword; and
a resistor ladder configured to receive the analog output signal and a second subword that has an integer number I bits that include an intermediate significant bit (ISB) of the digital input signal and generate an analog interpolated signal; and
a buffer amplifier configured to receive the analog interpolated signal and generate an output signal for the segmented DAC, wherein the buffer amplifier includes a chopper circuit configured to break up the analog interpolated signal received from the interpolation RDAC to be processed as an AC signal and integrate the AC signal back to a DC signal at an output of the buffer amplifier to generate the output signal for the segmented DAC.

* * * * *